United States Patent
Jalali et al.

(10) Patent No.: US 12,057,975 B2
(45) Date of Patent: *Aug. 6, 2024

(54) LIVE OFFSET CANCELLATION OF THE DECISION FEEDBACK EQUALIZATION DATA SLICERS

(71) Applicant: Cadence Design Systems, Inc., San Jose, CA (US)

(72) Inventors: Mohammad Sadegh Jalali, Toronto (CA); Marcus Van Ierssel, Toronto (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/140,142

(22) Filed: Apr. 27, 2023

(65) Prior Publication Data

US 2023/0388163 A1 Nov. 30, 2023

Related U.S. Application Data

(63) Continuation of application No. 17/298,165, filed as application No. PCT/US2019/065429 on Dec. 10, 2019, now Pat. No. 11,671,286.

(60) Provisional application No. 62/778,734, filed on Dec. 12, 2018.

(51) Int. Cl.
*H04L 25/03* (2006.01)

(52) U.S. Cl.
CPC .. *H04L 25/03267* (2013.01); *H04L 25/03057* (2013.01); *H04L 25/03146* (2013.01)

(58) Field of Classification Search
CPC ......... H04L 25/03267; H04L 25/03057; H04L 25/03146

See application file for complete search history.

(56) References Cited

U.S. PATENT DOCUMENTS

| | | |
|---|---|---|
| 5,268,872 A | 12/1993 | Fujii et al. |
| 7,075,465 B2 | 7/2006 | Jonsson et al. |
| 8,519,744 B2 | 8/2013 | Clemens |

(Continued)

OTHER PUBLICATIONS

Notification of Transmittal of the International Search Report and the Written Opinion of the International Searching Authority, or the Declaration with Mail Date Feb. 14, 2020 re: Int'l Appln. No. PCT/US2019/065429. 13 Pages.

*Primary Examiner* — Janice N Tieu
(74) *Attorney, Agent, or Firm* — Mark H. Whittenberger; Holland & Knight LLP

(57) ABSTRACT

A receiver utilizes loop-unrolled decision feedback equalization (DFE). For each sample, two comparators, each configured with different thresholds, sample an input signal. The output of one of these comparators is selected and used as the output of the receiver and may be optionally input to additional DFE circuitry. The output of the other (non-selected) comparator is used to adjust an input offset voltage of that same comparator. Adjustments to the offset voltages of the comparators may be based on a statistical analysis of the respective outputs of the two comparators when not selected. Adjustments to the offset voltages of the comparators may be based on comparisons between the respective outputs of the two comparators when not selected to the outputs of a reference comparator that has been calibrated for minimal or zero offset.

20 Claims, 13 Drawing Sheets

(56) References Cited

U.S. PATENT DOCUMENTS

| | | |
|---|---|---|
| 9,444,657 B2 | 9/2016 | Chen et al. |
| 9,479,365 B2 | 10/2016 | Chou et al. |
| 2009/0304066 A1* | 12/2009 | Chmelar ............... H03M 1/002 |
| | | 375/233 |
| 2017/0317859 A1* | 11/2017 | Hormati ............ H04L 25/03885 |

* cited by examiner

LIVE OFFSET CANCELLATION OF THE DECISION FEEDBACK EQUALIZATION DATA SLICERS

DETAILED DESCRIPTION OF THE EMBODIMENTS

Figure 1A:
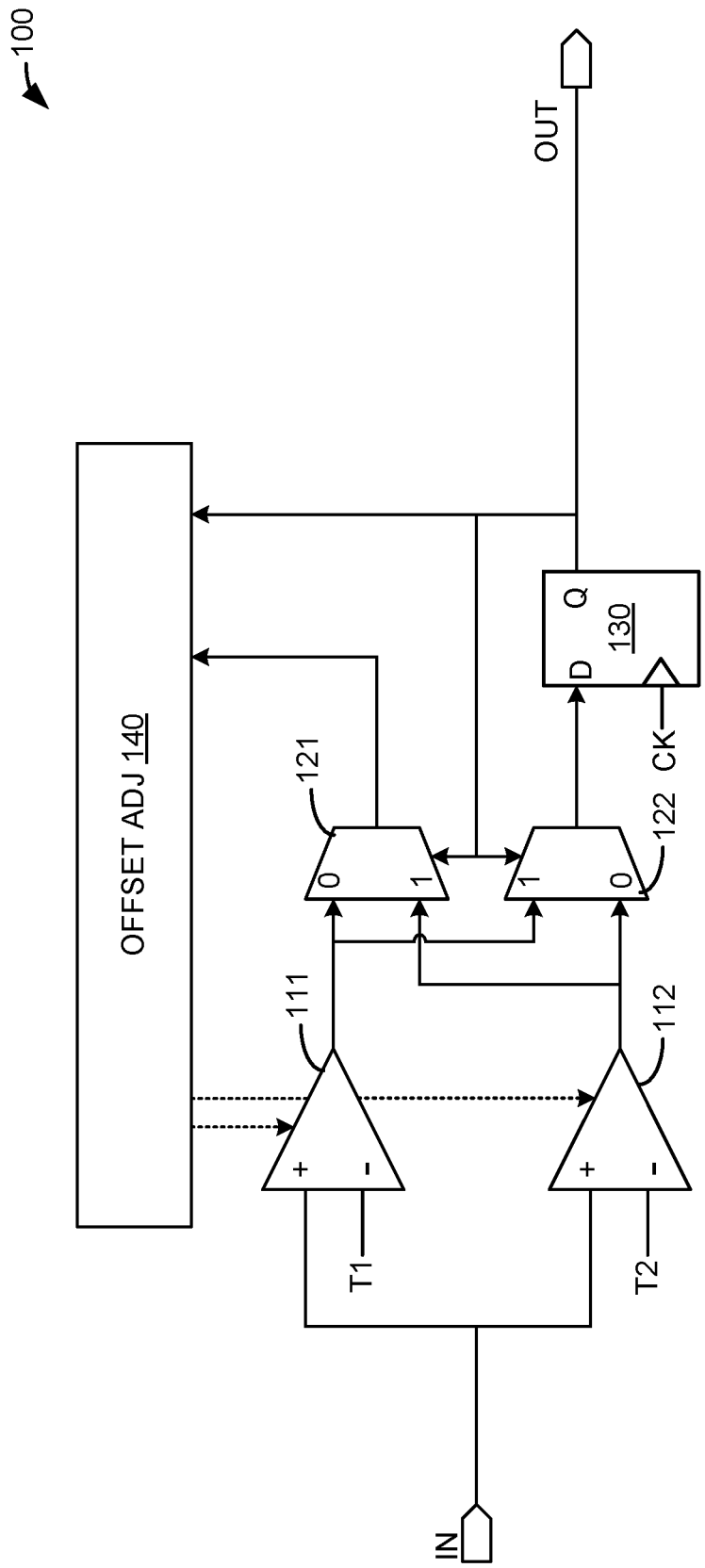
FIGS. 1A-1B are block diagrams illustrating receivers with loop-unrolled decision feedback equalization and offset cancellation.

The low pass nature of a communication channel causes inter-symbol interference (ISI), which manifests as a received symbol being corrupted by previous symbols. To improve the signal swing before sampling, a receiver may employ decision feedback equalization (DFE). DFE boosts the high frequency components of a signal based on the weighted feedback of one or more previously received symbols.

Because the DFE applies feedback based on the previous symbol(s), this places an upper limit on the length of time allowed to resolve a symbol and then apply feedback based on it. To relax this requirement, a commonly used approach is loop unrolling. In the case of non-return to zero (NRZ) signaling, loop unrolling creates two samples of the input signal: one applying equalization assuming the previous symbol was '0', the other applying equalization assuming the previous symbol was '1'. The previous symbol is then used to select one of these two samples. In an NRZ signaling implementation, the input signal may be sampled by two comparators (slicers) that have different thresholds. Based on the last received symbol, one of two comparators (selected comparator) provides the received symbol to be output by the receiver—(which is also the next symbol input to the DFE circuitry.) Other signaling schemes (e.g., PAM-4, PAM-8, etc.) may use a greater (e.g., 4, 8, etc.) number of samples/slicers/comparators.

In an embodiment, the output of the non-selected comparator is used to reduce/remove the input offset voltage of the non-selected comparator. In typical offset correction schemes, the input of a comparator is set to zero, and the offset adjusted until the comparator output reflects that it is straddling the decision threshold (generating 50% 1's and 50% 0's). This cannot be done while actively receiving data (a.k.a., live operation) since it would corrupt the received data. However, because the non-selected comparator has the incorrect equalization applied, it will degrade the signal and periodically resolve the wrong symbol. The degraded signal, which will periodically be near the comparator's threshold, provides the observability needed to adjust that comparator's offset while the receiver is actively receiving data (a.k.a., live operation.) To determine the adjustments to be made, the output of the non-selected comparator may be compared to the output of a reference comparator that samples the same input signal at the same time using the same threshold. Since the reference comparator has already been calibrated for reduced/removed offset, differences between the output of the non-selected comparator and the reference comparator indicate what adjustments need to be made to the offset of the non-selected comparator.

In another embodiment, comparator offset is calibrated using a statistical analysis that compares the output statistics of a first of the two comparators to the output statistics of the second of the two comparators. In particular, a lack of statistical symmetry between the first comparator's samples when the first comparator is the non-selected comparator and the second comparator's samples when the second comparator is the non-selected comparator indicates a common-mode input offset that is common to both of the comparators. Thus, when a lack of statistical symmetry is detected, adjustments may be made to one or both of the comparators to reduce/eliminate this common-mode offset. A relative, or differential, offset is indistinguishable from the DFE feedback weighting, and is canceled by adapting the DFE.

FIG. 1A is a block diagram illustrating a receiver with loop-unrolled decision feedback equalization and offset cancellation. In FIG. 1A, receiver 100 comprises comparator 111, comparator 112, selector (e.g., MUX) 121, selector 122, latch 130, and offset adjust 140.

Offset adjust 140 is operatively coupled to comparator 111 to change, adjust, compensate for, or otherwise affect, reduce, minimize and/or eliminate the input offset voltage of comparator 111. Likewise, offset adjust 140 is operatively coupled to comparator 112. Offset adjust 140 is operatively coupled to comparator 112 to change, adjust, compensate for, or otherwise affect, reduce, minimize and/or eliminate the input offset voltage of comparator 112.

Receiver 100 receives an input signal (IN) that is provided to comparator 111 and comparator 112. Comparator 111 compares the input signal to a first threshold (T1). Comparator 112 compares the input signal to a second threshold (T2). Threshold T1 is greater than threshold T2. Threshold T1 is selected such that the comparator's decision point will be displaced by an amount equal to the inter-symbol interference (ISI) from a previous symbol that is assumed to be '1', thereby, when the previous symbol is a '1', providing tap #1 equalization for that ISI. Threshold T2 is selected such that the comparator's decision point will be displaced by an amount equal to the ISI from a previous symbol that is assumed to be '0', thereby, when the previous symbol is a '0', providing tap #1 equalization for that ISI.

The output of comparator 111 is provided to the '0' input of MUX 121 and the '1' input of MUX 122. The output of comparator 112 is provided to the '1' input of MUX 121 and the '0' input of MUX 122. The output of MUX 121 is provided to offset adjust 140. The output of MUX 122 is provided to the input of latch 130. The output of latch 130 is provided as the receiver output OUT. The output of latch 130 is also provided to the control input of MUX 121, the control input of MUX 122, and offset adjust 140.

The control inputs of MUX 121 and MUX 122 receive the value output by latch 130. Thus, if the value output by latch 130 is a '0' (i.e., the previous symbol was a '0') MUX 121 provides the output of comparator 111 to offset adjust 140, and MUX 122 provides the output of comparator 112 to the input of latch 130. If the value output by latch 130 is a '1' (i.e., the previous symbol was a '1') MUX 122 provides the output of comparator 111 to the input of latch 130, and MUX 121 provides the output of comparator 112 to offset adjust 140. In response to a timing reference signal, CK, the value received at the input of latch 130 is transferred into latch 130 and held at the output of latch 130. Thus, the value selected by MUX 122 in a previous cycle is transferred to the output of latch 130 to determine which of the sources (comparator 111 or comparator 112) that receiver 100 is to use as the data source for that cycle, and which is to be used for offset cancelation information. The output of latch 130 (i.e., received symbol) is provided to offset adjust 140, and as the output of receiver 100.

In an embodiment, the output of the non-selected comparator (i.e. the comparator 111 or 112 selected by MUX 121) is used by offset adjust 140 to adjust the offset of the non-selected comparator. The output of the selected comparator (i.e., the comparator 111 or 112 selected by MUX 122), while being stored by latch 130, may be used by offset adjust 140 to determine which of comparator 111 or 112 provided the sample in the previous cycle that is to be used for offset adjustment. In alternate embodiments, the output of MUX 122 may be provided to offset adjust 140 directly from MUX 122, or the output of another latch holding the value of the selected comparator during a later cycle may be used to determine which of comparator 111 or 112 provided the sample. Offset adjust 140 is operatively coupled to comparator 111 to adjust/reduce/remove the input offset voltage comparator 111 based on the values output by comparator 111 when comparator 111 is the non-selected comparator. Offset adjust 140 is operatively coupled to comparator 112 to adjust/reduce/remove the input offset voltage of comparator 112 based on the values output by comparator 112 when comparator 112 is the non-selected comparator.

In an embodiment, offset adjust 140 may use a contiguous set of the value output by comparators 111 and/or 112 to adjust the input offset voltages. In another embodiment, offset adjust 140 may use a selected sample set of the value output by comparators 111 and/or 112 to adjust the input offset voltages. For example, offset adjust 140 may use the values output every $10^{th}$, $100^{th}$, $1000^{th}$, etc., cycle to adjust the input offset voltages. In another embodiment, offset adjust 140 may use randomly selected output values (or values from randomly selected cycles) to adjust the input offset voltages.

Offset adjust 140 may adjust the offset of the non-selected comparator 111-112 based on a statistical analysis of the data output by the non-selected comparator 111-112. For example, offset adjust 140 may compare the percentage of 1's (or a count of 1's) produced by comparator 111 when it is the non-selected comparator to the percentage of 0's (or a count of 0's) produced by comparator 112 when it is the non-selected comparator. If these two percentages (or counts) of 1's) are not 'symmetrical' such that the percentage of 1's produced by comparator 111 is not substantially equal to (i.e., it deviates from by a statistically significant amount) the percentage of 0's produced by comparator 112, then offset adjust 140 may adjust the input offset voltage of one or both of comparators 111 and 112 in order to produce more symmetrical percentages (or counts.)

For example, if comparator 112, when it is the non-selected comparator, produces 52% 1's then comparator 111, when it is the non-selected comparator, should produce 52% 0's when the common-mode input voltage offset between comparators 111-112 is substantially eliminated. If comparator 111, when it is the non-selected comparator, produces greater than 52% 0's, then offset adjust 140 can adjust the input voltage offset of comparator 111 in a manner that effectively decreases threshold T1. Likewise, if comparator 111, when it is the non-selected comparator, produce less than 52% 0's, then offset adjust 140 can adjust the input voltage offset of comparator 111 in a manner that effectively increases threshold T1. It should be understood that similar, but complementary, adjustments can be made to comparator 112 depending on the statistics comparator 112 produces when it is the non-selected comparator.

In an embodiment, offset adjust 140 is circuitry and/or software running on the same integrated circuit as the rest of receiver 100. In another embodiment, offset adjust 140 may be software running on a separate integrated circuit that can control the offsets of comparator 111 and/or comparator 112—for example by writing to one or more registers that control one or more digital-to-analog converters whose output(s) affect the offsets of comparators 111 and/or 112.

Figure 1B:
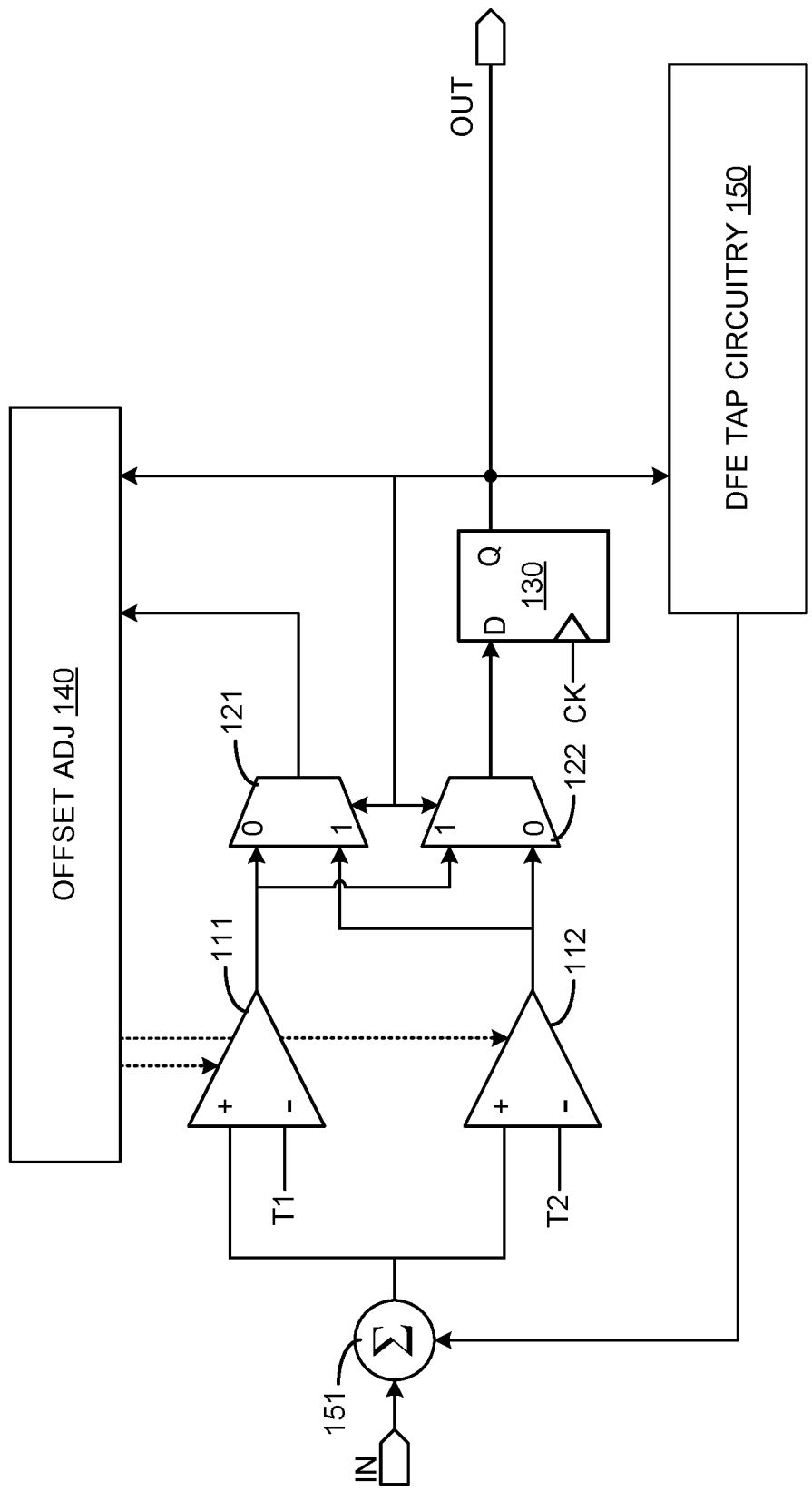

FIG. 1B is a block diagram illustrating a receiver with loop-unrolled decision feedback equalization and offset cancellation. In FIG. 1B, receiver 101 comprises comparator 111, comparator 112, selector (MUX) 121, selector 122, latch 130, offset adjust 140, decision feedback tap circuitry 150, and summer 151. Decision feedback tap circuitry 150 and summer 151 is circuitry that represents tap #2 and (if present) higher decision feedback equalization (DFE) for receiver 101, that applies feedback from one or more symbols prior to the immediately preceding symbol. The higher number of DFE taps represented by DFE 150 can further boost the high frequency components of the input signal based on the weighted feedback of more previously received symbols. Thus, DFE 150 can further improve the signal eye opening before sampling.

Offset adjust 140 is operatively coupled to comparator 111 to change, adjust, compensate for, or otherwise affect, reduce, minimize and/or eliminate the input offset voltage of comparator 111. Likewise, offset adjust 140 is operatively coupled to comparator 112. Offset adjust 140 is operatively coupled to comparator 112 to change, adjust, compensate for, or otherwise affect, reduce, minimize and/or eliminate the input offset voltage of comparator 112.

Receiver 101 receives an input signal (IN) that is added by summer 151 to a signal received from DFE tap circuitry 150. The output of summer 151 is a partially (i.e., by at least tap #2 and optionally higher—but not tap #1) equalized input signal. The partially equalized input signal is provided to comparator 111 and comparator 112. Comparator 111 compares the partially equalized input signal to a first threshold (T1). Comparator 112 compares the partially equalized input signal to a second threshold (T2). Threshold T1 is greater than threshold T2. Threshold T1 is selected such that the comparator's decision point will be displaced by an amount equal to the ISI from a previous symbol that is assumed to be '1', thereby, when the previous symbol is a '1', providing tap #1 equalization for that ISI. Threshold T2 is selected such that the comparator's decision point will be displaced by an amount equal to the ISI from a previous symbol that is assumed to be '0', thereby, when the previous symbol is a '0', providing tap #1 equalization for that ISI.

The output of comparator 111 is provided to the '0' input of MUX 121 and the '1' input of MUX 122. The output of comparator 112 is provided to the '1' input of MUX 121 and the '0' input of MUX 122. The output of MUX 121 is provided to offset adjust 140. The output of MUX 122 is provided to the input of latch 130. The output of latch 130 is provided as the receiver output OUT. The output of latch 130 is also provided to DFE tap circuitry 150, the control input of MUX 121, the control input of MUX 122, and offset adjust 140.

The control inputs of MUX 121 and MUX 122 receive the value output by latch 130. Thus, if the value output by latch 130 is a '0' MUX 121 provides the output of comparator 111 to offset adjust 140, and MUX 122 provides the output of comparator 112 to the input of latch 130. If the value output by latch 130 is a '1' MUX 122 provides the output of comparator 111 to the input of latch 130, and MUX 121 provides the output of comparator 112 to offset adjust 140. In response to a timing reference signal, CK, the value received at the input of latch 130 is transferred into latch 130 and held at the output of latch 130. Thus, the value selected by MUX 122 in a previous cycle is transferred to the output of latch 130 to determine which of the sources (comparator 111 or comparator 112) that receiver 101 is to use as a data source and which is to be used for offset cancelation. The output of latch 130 (i.e., received symbol) is provided to DFE tap circuitry 150, offset adjust 140, and as the output of receiver 101.

In an embodiment, the output of the non-selected comparator (i.e. the comparator 111 or 112 selected by MUX 121) is used by offset adjust 140 to adjust the offset of the non-selected comparator. The output of the selected comparator (i.e., the comparator 111 or 112 selected by MUX 122), while being stored by latch 130, may be used by offset adjust 140 to determine which of comparator 111 or 112 provided the sample in the previous cycle that is to be used for offset adjustment. In alternate embodiments, the output of MUX 122 may be provided to offset adjust 140 directly from MUX 122, or the output of another latch holding the value of the selected comparator during a later cycle may be used to determine which of comparator 111 or 112 provided the sample. Offset adjust 140 is operatively coupled to comparator 111 to adjust/reduce/remove the input offset voltage comparator 111 based on the values output by comparator 111 when comparator 111 is the non-selected comparator. Offset adjust 140 is operatively coupled to comparator 112 to adjust/reduce/remove the input offset voltage of comparator 112 based on the values output by comparator 112 when comparator 112 is the non-selected comparator.

In an embodiment, offset adjust 140 may use a contiguous set of the value output by comparators 111 and/or 112 to adjust the input offset voltages. In another embodiment, offset adjust 140 may use a selected sample set of the value output by comparators 111 and/or 112 to adjust the input offset voltages. For example, offset adjust 140 may use the values output every $10^{th}$, $100^{th}$, $1000^{th}$, etc., cycle to adjust the input offset voltages. In another embodiment, offset adjust 140 may use randomly selected output values (or values from randomly selected cycles) to adjust the input offset voltages.

Offset adjust 140 may adjust the offset of the non-selected comparator 111-112 based on a statistical analysis of the data output by the non-selected comparator 111-112. For example, offset adjust 140 may compare the percentage of 1's (or a count of 1's) produced by comparator 111 when it is the non-selected comparator to the percentage of 0's (or a count of 0's) produced by comparator 112 when it is the non-selected comparator. If these two percentages (or counts) are not 'symmetrical' such that the percentage of 1's produced by comparator 111 is not substantially equal to (i.e., it deviates from by a statistically significant amount) the percentage of 0's produced by comparator 112, then offset adjust 140 may adjust the input offset voltage of one or both of comparators 111 and 112 in order to produce more symmetrical percentages (or counts.)

For example, if comparator 112, when it is the non-selected comparator, produces 52% 1's then comparator 111, when it is the non-selected comparator, should produce 52% 0's when the common-mode input voltage offset between comparators 111-112 is substantially eliminated. If comparator 111, when it is the non-selected comparator, produces greater than 52% 0's, then offset adjust 140 can adjust the input voltage offset of comparator 111 in a manner that effectively decreases threshold T1. Likewise, if comparator 111, when it is the non-selected comparator, produce less than 52% 0's, then offset adjust 140 can adjust the input voltage offset of comparator 111 in a manner that effectively increases threshold T1. It should be understood that similar, but complementary, adjustments can be made to comparator 112 depending on the statistics comparator 112 produces when it is the non-selected comparator.

In an embodiment, offset adjust 140 is circuitry and/or software running on the same integrated circuit as the rest of receiver 101. In another embodiment, offset adjust 140 may be software running on a separate integrated circuit that can control the offsets of comparator 111 and/or comparator 112—for example by writing to one or more registers that control one or more digital-to-analog converters whose output(s) affect the offsets of comparators 111 and/or 112.

Figure 2A:
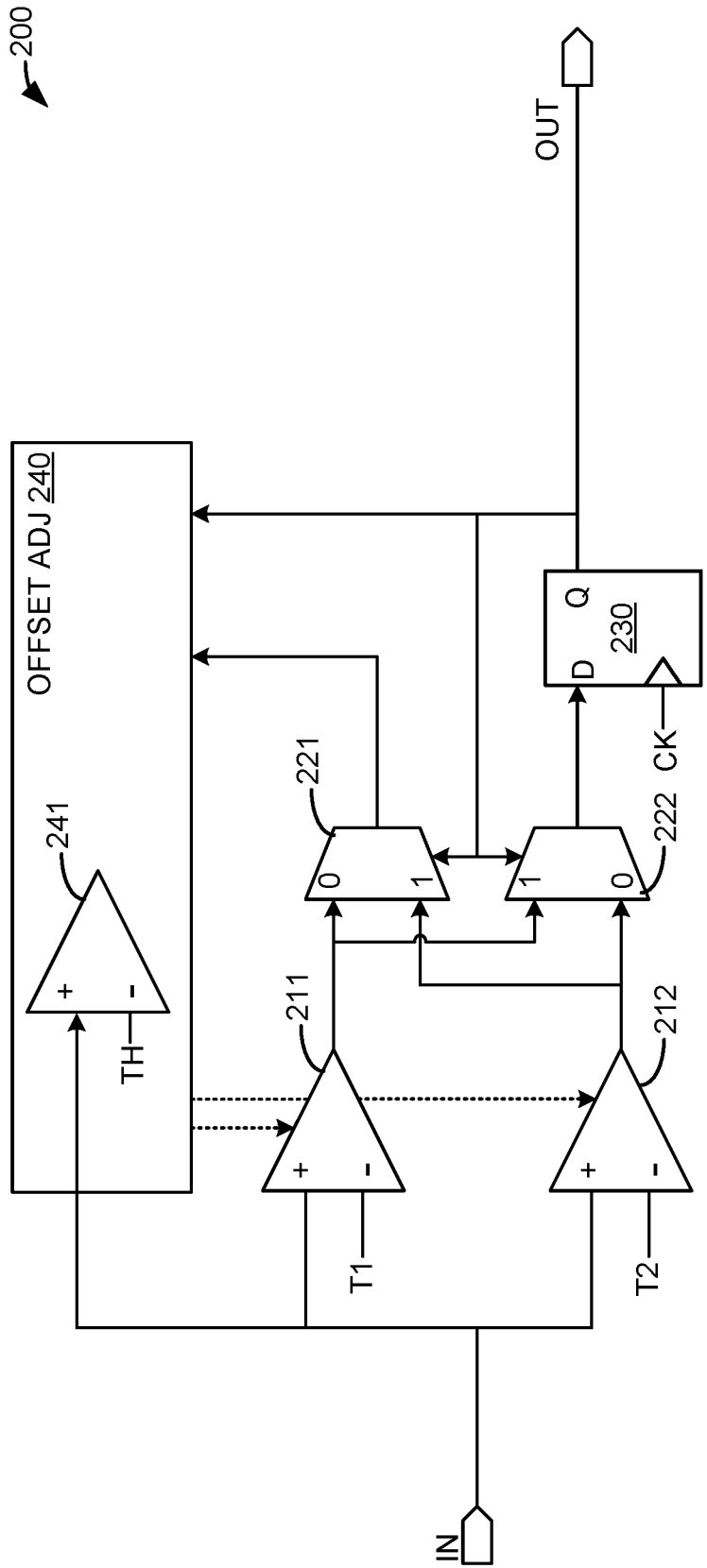
FIGS. 2A-2B are block diagrams illustrating a receiver with loop-unrolled decision feedback equalization and offset cancellation using a reference comparator.

FIG. 2A is block diagram illustrating a receiver with loop-unrolled decision feedback equalization and offset cancellation using a reference comparator. Rather than statistical methods, use of a reference comparator that has been calibrated (i.e., to have minimal or no offset) provides a baseline set of compare results that are not skewed by an offset. These results can be used to calibrate the other comparators in the receiver to have no offset. In FIG. 2A, receiver 200 comprises comparator 211, comparator 212, selector (MUX) 221, selector 222, latch 230, and offset adjust 240. Offset adjust 240 includes reference comparator 241.

Offset adjust 240 is operatively coupled to comparator 211. Offset adjust 240 is operatively coupled to comparator 211 to change, adjust, compensate for, or otherwise affect, reduce, minimize and/or eliminate the input offset voltage of comparator 211. Likewise, offset adjust 240 is operatively coupled to comparator 212. Offset adjust 240 is operatively coupled to comparator 212 to change, adjust, compensate for, or otherwise affect, reduce, minimize and/or eliminate the input offset voltage of comparator 212.

Receiver 200 receives an input signal (IN) that is provided to comparator 211, comparator 212, and reference comparator 241. Comparator 211 compares the input signal to a first threshold (T1). Comparator 212 compares the input signal to a second threshold (T2). Threshold T1 is greater than threshold T2. Threshold T1 is selected such that the comparator's decision point will be displaced by an amount equal to the ISI from a previous symbol that is assumed to be '1', thereby, when the previous symbol is a '1', providing tap #1 equalization for that ISI. Threshold T2 is selected such that the comparator's decision point will be displaced by an amount equal to the ISI from a previous symbol assumed to be '0', thereby, when the previous symbol is a '0', providing tap #1 equalization for that ISI.

The output of comparator 211 is provided to the '0' input of MUX 221 and the '1' input of MUX 222. The output of comparator 212 is provided to the '1' input of MUX 221 and the '0' input of MUX 222. The output of MUX 221 is provided to offset adjust 240. The output of MUX 222 is provided to the input of latch 230. The output of latch 230 is provided as the receiver output OUT. The output of latch 230 is also provided to the control input of MUX 221, the control input of MUX 222, and offset adjust 240.

The control inputs of MUX 221 and MUX 222 receive the value output by latch 230. Thus, if the value output by latch 230 is a '0' MUX 221 provides the output of comparator 211 to offset adjust 240, and MUX 222 provides the output of comparator 212 to the input of latch 230. If the value output by latch 230 is a '1' MUX 222 provides the output of comparator 211 to the input of latch 230, and MUX 221 provides the output of comparator 212 to offset adjust 240. In response to a timing reference signal, CK, the value received at the input of latch 230 is transferred into latch 230 and held at the output of latch 230. Thus, the value selected by MUX 222 in a previous cycle is transferred to the output of latch 230 to determine which of the sources (comparator 211 or comparator 212) that receiver 200 is to use as a data source and which is to be used for offset cancelation. The output of latch 230 (i.e., received symbol) is provided to DFE tap circuitry 250, offset adjust 240, and as the output of receiver 200.

In an embodiment, the output of the non-selected comparator (i.e. the comparator 211 or 212 selected by MUX 221) is used by offset adjust 240 to adjust the offset of the non-selected comparator. The output of the selected comparator (i.e., the comparator 211 or 212 selected by MUX 222), while being stored by latch 230, may be used by offset adjust 240 to determine which of comparator 211 or 212 provided the sample in the previous cycle that is to be used for offset adjustment. In alternate embodiments, the output of MUX 222 may be provided to offset adjust 240 directly from MUX 222, or the output of another latch holding the value of the selected comparator during a later cycle may be used to determine which of comparator 211 or 212 provided the sample. Offset adjust 240 is operatively coupled to comparator 211 to adjust/reduce/remove the input offset voltage comparator 211 based on the values output by comparator 211 when comparator 211 is the non-selected comparator. Offset adjust 240 is operatively coupled to comparator 212 to adjust/reduce/remove the input offset voltage of comparator 212 based on the values output by comparator 212 when comparator 212 is the non-selected comparator.

In an embodiment, offset adjust 240 may use a contiguous set of the values output by comparators 211 and/or 212 to adjust the input offset voltages. In another embodiment, offset adjust 240 may use selected sample set of the values output by comparators 211 and/or 212 to adjust the input offset voltages. For example, offset adjust 240 may use the values output every $10^{th}$, $100^{th}$, $1000^{th}$, etc., cycle to adjust the input offset voltages. In another embodiment, offset adjust 240 may use randomly selected output values (or values from randomly selected cycles) to adjust the input offset voltages.

In an embodiment, reference comparator 241 is calibrated to have an input voltage offset that is minimized and/or substantially eliminated. For example, the threshold TH input to reference comparator may be set to a data level that should produce a 50% transition density. One way to accomplish a 50% transition is if the threshold TH input is set to the middle of the top (i.e., '1') eye contour. In this case, reference comparator 241 should produce a 50% transition density when the received data corresponds to a '1'. A similar setting of the threshold input TH may utilize the bottom (i.e., '0') eye contour when the received data corresponds to a '0'. If the transition density of the offset of reference comparator 241 is not 50%, the input voltage offset of reference comparator 241 may be adjusted until a 50% transition density is achieved (or substantially achieved.) Reference comparator 241 and/or offset adjust 240 may be configured so that reference comparator 241 samples the input signal at the same time as comparators 211-212. It should be understood that other methods of calibrating reference comparator 241 to have substantially (or effectively) no input voltage offset may be used. For example, offline comparison of known voltage levels, sweeping an input voltage, etc. may be used to determine and substantially eliminate any input offset voltage reference comparator 241 may have.

After reference comparator 241 has been calibrated to have substantially (or effectively) no input voltage offset, offset adjust 240 may adjust the offset of a given non-selected comparator 211 or 212. To adjust the offset of a given non-selected comparator 211 or 212, offset adjust 240 may set the threshold TH input to reference comparator 241 equal to the corresponding threshold T1 or T2 of the respective comparator 211 or 212 being adjusted. Results obtained by comparing effectively simultaneous samples made by the comparator 211 or 212 being adjusted and the 'known good' reference comparator 241 can be used by offset adjust 240 to adjust/minimize/eliminate the input voltage offset of the comparator 211 or 212 being adjusted. For example, if, for a given sample, reference comparator 241 produced a '1' and comparator 211 produced a '0', then offset voltage adjust 240 could adjust the offset voltage of comparator 211 in a manner that would effectively decrease threshold T1—and thereby increase the likelihood the output of comparator 211 would match the output of the "offset free" reference comparator 241. Conversely, if, for a given sample, reference comparator 241 produced a '0' and comparator 211 produced a '1', then offset voltage adjust 240 could adjust the offset voltage of comparator 211 in a manner that would effectively increase threshold T1—and thereby increase the likelihood the output of comparator 211 would match the output of the "zero offset" reference comparator 241. In an embodiment, TH may be calibrated to ideal DFE tap #1 slicing levels. Thus, as comparators 211 and 212 are being adjusted, the DFE is also being adapted. It should be understood that the time it takes to adjust comparators 211 and 212 and the time over which the DFE is being adapted are substantially very different. This difference helps avoid the adjustment of comparators 211 and 212 from interfering with the DFE adaptation, and vice versa.

In an embodiment, offset adjust 240 is circuitry and/or software running on the same integrated circuit as the rest of receiver 200. In another embodiment, offset adjust 240 may be software running on a separate integrated circuit that can control the offsets of comparator 211 and/or comparator 212—for example by writing to one or more registers that control one or more digital-to-analog converters whose output(s) affect the offsets of comparators 211 and/or 212.

Figure 2B:
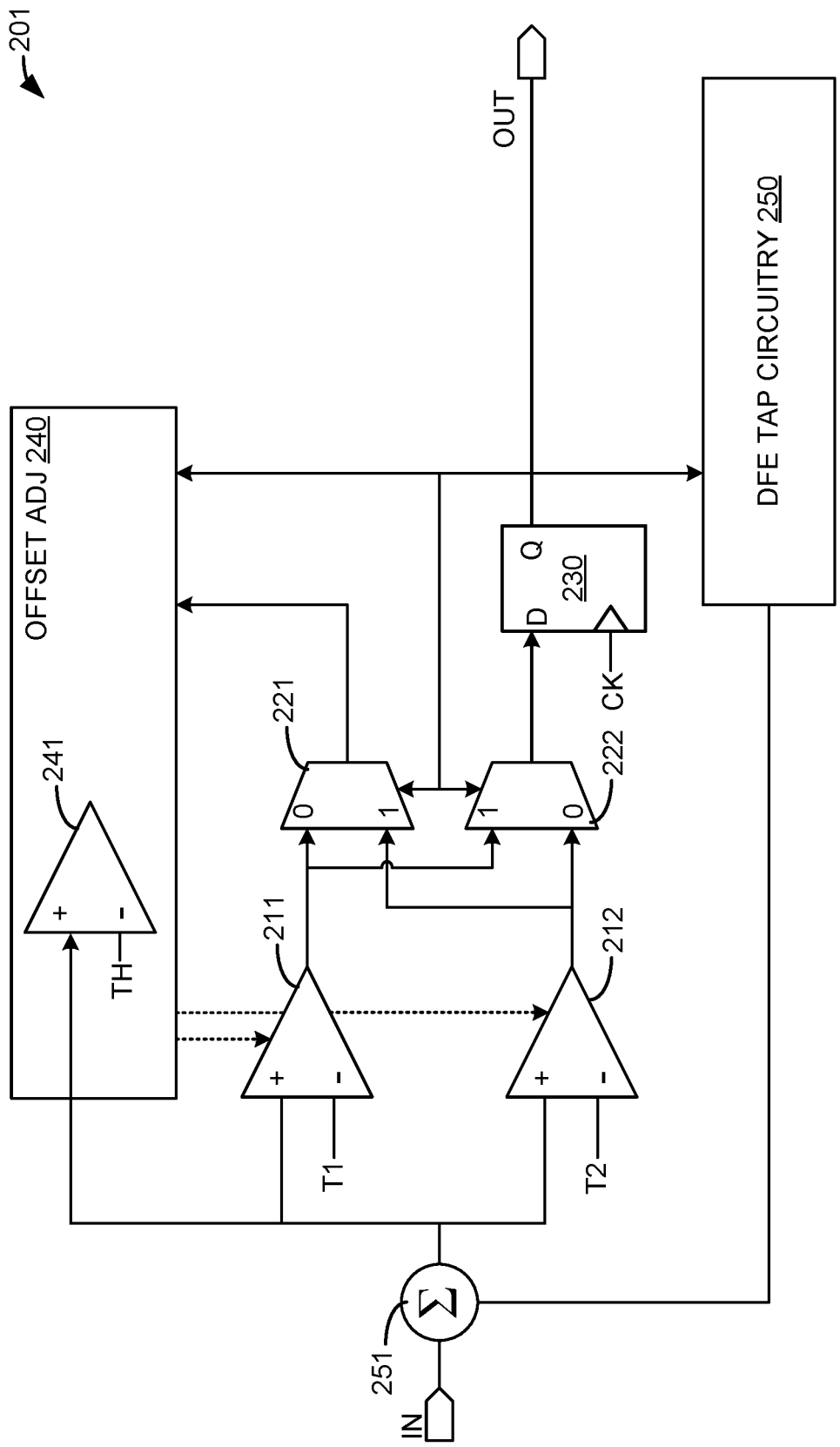

FIG. 2B is block diagram illustrating a receiver with loop-unrolled decision feedback equalization and offset cancellation using a reference comparator. In FIG. 2B, receiver 201 comprises comparator 211, comparator 212, selector (MUX) 221, selector 222, latch 230, offset adjust 240, decision feedback tap circuitry 250, and summer 251. Decision feedback tap circuitry 250 and summer 251 is circuitry that represents tap #2 and (if present) higher decision feedback equalization (DFE) for receiver 201, that applies feedback from one or more symbols prior to the immediately preceding symbol. The higher number of DFE taps represented by DFE 250 can further boost the high frequency components of the input signal based on the weighted feedback of more previously received symbols. Thus, DFE 250 can further improve the signal swing before sampling. Offset adjust 240 includes reference comparator 241.

Offset adjust 240 is operatively coupled to comparator 211. Offset adjust 240 is operatively coupled to comparator 211 to change, adjust, compensate for, or otherwise affect, reduce, minimize and/or eliminate the input offset voltage of comparator 211. Likewise, offset adjust 240 is operatively coupled to comparator 212. Offset adjust 240 is operatively coupled to comparator 212 to change, adjust, compensate for, or otherwise affect, reduce, minimize and/or eliminate the input offset voltage of comparator 212.

Receiver 200 receives an input signal (IN) that is added by summer 251 to a signal received from DFE tap circuitry 250. The output of summer 251 is an equalized input signal. The equalized input signal is provided to comparator 211, comparator 212, and reference comparator 241. Comparator 211 compares the equalized input signal to a first threshold (T1). Comparator 212 compares the equalized input signal to a second threshold (T2). Threshold T1 is greater than threshold T2. Threshold T1 is selected such that when the previous received symbol is a "1", threshold T1 will be met (i.e., equalized input voltage will be higher than T1) by the equalized input signal receiving a "1" on the current cycle and will not be met (i.e., equalized input voltage will be lower than T1) by the equalized input signal receiving a "0" on the current cycle. Threshold T2 is selected such that when the previous received symbol is a "0", threshold T2 will be met (i.e., equalized input voltage will be higher than T2) by the equalized input signal receiving a "1" on the current cycle and will not be met (i.e., equalized input voltage will be lower than T2) by the equalized input signal receiving a "0" on the current cycle.

The output of comparator 211 is provided to the "0" input of MUX 221 and the "1" input of MUX 222. The output of comparator 212 is provided to the "1" input of MUX 221 and the "0" input of MUX 222. The output of MUX 221 is provided to offset adjust 240. The output of MUX 222 is provided to the input of latch 230. The output of latch 230 is provided as the receiver output OUT. The output of latch 230 is also provided to DFE tap circuitry, the control input of MUX 221, the control input of MUX 222, and offset adjust 240.

The control inputs of MUX 221 and MUX 222 receive the value output by latch 230. Thus, if the value output by latch 230 is a "0" MUX 221 provides the output of comparator 211 to offset adjust 240, and MUX 222 provides the output of comparator 212 to the input of latch 230. If the value output by latch 230 is a "1" MUX 221 provides the output of comparator 211 to the input of latch 230, and MUX 222 provides the output of comparator 212 to offset adjust 240. In response to a timing reference signal, CK, the value received at the input of latch 230 is transferred into latch 230 and held at the output of latch 230. Thus, the value selected by MUX 222 in a previous cycle is transferred to the output of latch 230 to determine which of the sources (comparator 211 or comparator 212) that receiver 200 is to use as a data source and which is to be used for offset cancelation. The output of latch 230 (i.e., received symbol) is provided to DFE tap circuitry 250, offset adjust 240, and as the output of receiver 200.

In an embodiment, the output of the non-selected comparator (i.e. the comparator 211 or 212 selected by MUX 221) is used by offset adjust 240 to adjust the offset of the non-selected comparator. The output of the selected comparator (i.e., the comparator 211 or 212 selected by MUX 222), while being stored by latch 230, may be used by offset adjust 240 to determine which of comparator 211 or 212 provided the sample in the previous cycle that is to be used for offset adjustment. In alternate embodiments, the output of MUX 222 may be provided to offset adjust 240 directly from MUX 222, or the output of another latch holding the value of the selected comparator during a later cycle may be used to determine which of comparator 211 or 212 provided the sample. Offset adjust 240 is operatively coupled to comparator 211 to adjust/reduce/remove the input offset voltage comparator 211 based on the values output by comparator 211 when comparator 211 is the non-selected comparator. Offset adjust is operatively coupled to comparator 212 to adjust/reduce/remove the input offset voltage of comparator 212 based on the values output by comparator 212 when comparator 212 is the non-selected comparator.

In an embodiment, offset adjust 240 may use a contiguous set of the value output by comparators 211 and/or 212 to adjust the input offset voltages. In another embodiment, offset adjust 240 may use selected sample set of the value output by comparators 211 and/or 212 to adjust the input offset voltages. For example, offset adjust 240 may use the values output every $10^{th}$, $100^{th}$, $1000^{th}$, etc., cycle to adjust the input offset voltages. In another embodiment, offset adjust 240 may use randomly selected output values (or values from randomly selected cycles) to adjust the input offset voltages.

In an embodiment, reference comparator 241 is calibrated to have an input voltage offset that is minimized and/or substantially eliminated. For example, the threshold TH input to reference comparator may be set to a data level that should produce a 50% transition density. One way to accomplish a 50% transition is if the threshold TH input is set to the middle of the top (i.e., '1') eye contour. In this case, reference comparator 241 should produce a 50% transition density when the received data corresponds to a '1'. A similar setting of the threshold input TH may utilize the bottom (i.e., '0') eye contour when the received data corresponds to a '0'. If the transition density of the offset of reference comparator 241 is not 50%, the input voltage offset of reference comparator 241 may be adjusted until a 50% transition density is achieved (or substantially achieved.) Reference comparator 241 and/or offset adjust 240 may be configured so that reference comparator 241 samples the equalized input signal at the same time as comparators 211-212. It should be understood that other methods of calibrating reference comparator 241 to have substantially (or effectively) no input voltage offset may be used. For example, offline comparison of known voltage levels, sweeping an input voltage, etc. may be used to determine and substantially eliminate any input offset voltage reference comparator 241 may have.

After reference comparator 241 has been calibrated to have substantially (or effectively) no input voltage offset, offset adjust 240 may adjust the offset of a given non-selected comparator 211 or 212. To adjust the offset of a given non-selected comparator 211 or 212, offset adjust 240 may set the threshold TH equal to the corresponding threshold T1 or T2 of the respective comparator 211 or 212 being adjusted. Results obtained by comparing effectively simultaneous samples made by the comparator 211 or 212 being adjusted and the 'known good' reference comparator 241 can be used by offset adjust 240 to adjust/minimize/eliminate the input voltage offset of the comparator 211 or 212 being adjusted. For example, if, for a given sample, reference comparator 241 produced a "1" and comparator 211 produced a "0", then offset voltage adjust 240 could adjust the offset voltage of comparator 211 in a manner that would effectively increase threshold T1—and thereby increase the likelihood the output of comparator 211 would match the output of the "offset free" reference comparator 241. Conversely, if, for a given sample, reference comparator 241 produced a "0" and comparator 211 produced a "1", then offset voltage adjust 240 could adjust the offset voltage of comparator 211 in a manner that would effectively decrease threshold T1—and thereby increase the likelihood the output of comparator 211 would match the output of the "zero offset" reference comparator 241.

In an embodiment, offset adjust 240 is circuitry and/or software running on the same integrated circuit as the rest of receiver 200. In another embodiment, offset adjust 240 may be software running on a separate integrated circuit that can control the offsets of comparator 211 and/or comparator 212—for example by writing to one or more registers that control one or more digital-to-analog converters whose output(s) affect the offsets of comparators 211 and/or 212.

Figure 3A:
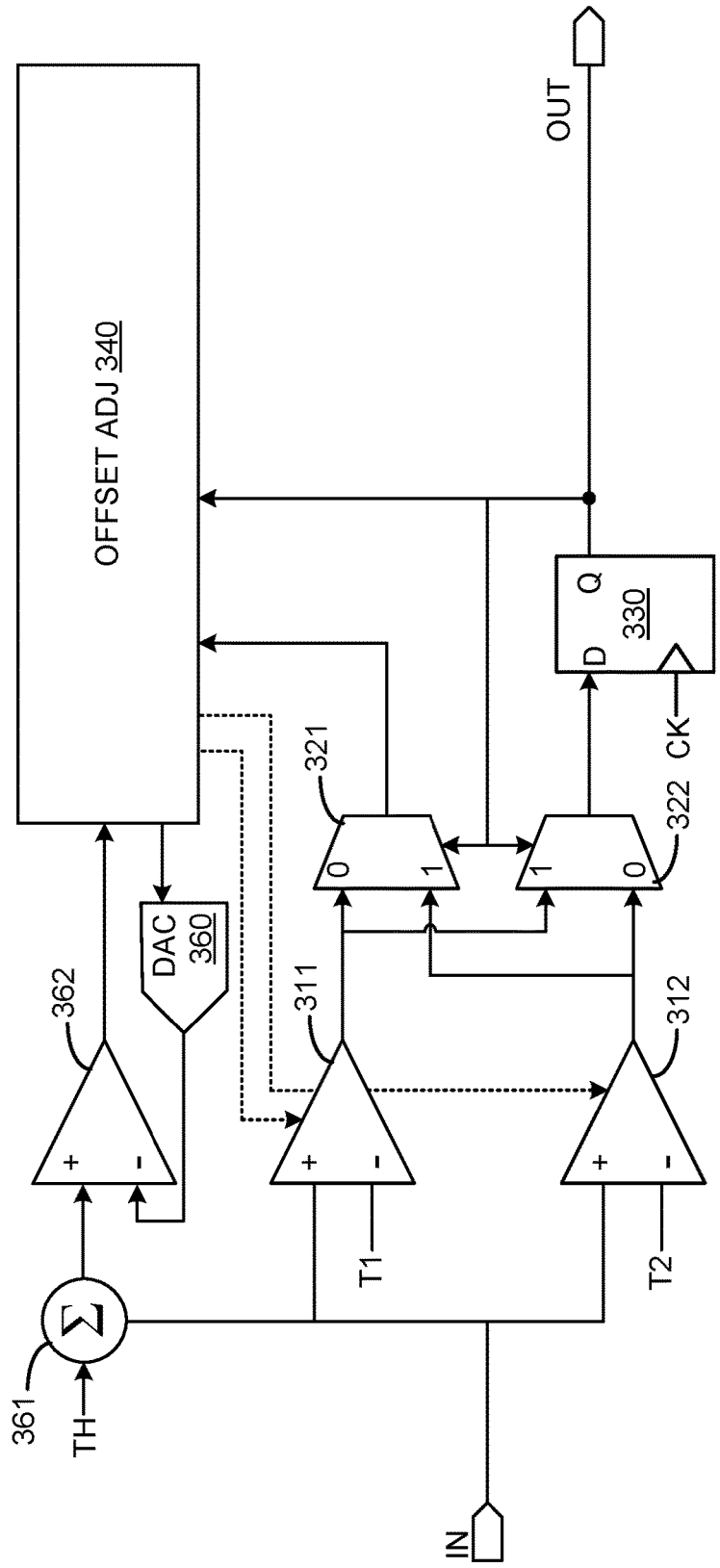
FIGS. 3A-3B are block diagrams illustrating a receiver with loop-unrolled decision feedback equalization and offset cancellation that uses an eye monitor comparator.

FIG. 3A is a block diagram illustrating a receiver with loop-unrolled decision feedback equalization and offset cancellation that uses an eye monitor comparator. Re-purposing or sharing the eye monitor comparator between eye monitoring and comparator calibrations reduces the amount of circuitry used to implement receiver 300. In FIG. 3A, receiver 300 comprises comparator 311, comparator 312, selector (MUX) 321, selector 322, latch 330, offset adjust 340, digital-to-analog converter (DAC) 360, summer 361, and comparator 362. Comparator 362, DAC 360, and/or summer 361 may be repurposed, in other modes, for use as part of a signal eye monitor.

Offset adjust 340 is operatively coupled to comparator 311. Offset adjust 340 is operatively coupled to comparator 311 to change, adjust, compensate for, or otherwise affect, reduce, minimize and/or eliminate the input offset voltage of comparator 311. Likewise, offset adjust 340 is operatively coupled to comparator 312. Offset adjust 340 is operatively coupled to comparator 312 to change, adjust, compensate for, or otherwise affect, reduce, minimize and/or eliminate the input offset voltage of comparator 312.

Receiver 300 receives an input signal (IN) that is provided to comparator 311, comparator 312, and summer 361. The output of summer 361 is provided to comparator 362. The output of comparator 362 is provided to offset adjust 340. Offset adjust 340 also controls DAC 360. The output of DAC 360 is provided to comparator 362.

Comparator 311 compares the input signal to a first threshold (T1). Comparator 312 compares the input signal to a second threshold (T2). Threshold T1 is greater than threshold T2. Threshold T1 is selected such that the comparator's decision point will be displaced by an amount equal to the ISI from a previous symbol that is assumed to be '1', thereby, when the previous symbol is a '1', providing tap #1 equalization for that ISI. Threshold T2 is selected such that the comparator's decision point will be displaced by an amount equal to the ISI from a previous symbol that is assumed to be '0', thereby, when the previous symbol is a '0', providing tap #1 equalization for that ISI.

The output of comparator 311 is provided to the '0' input of MUX 321 and the '1' input of MUX 322. The output of comparator 312 is provided to the '1' input of MUX 321 and the '0' input of MUX 322. The output of MUX 321 is provided to offset adjust 340. The output of MUX 322 is provided to the input of latch 330. The output of latch 330 is provided as the receiver output OUT. The output of latch 330 is also provided to the control input of MUX 321, the control input of MUX 322, and offset adjust 340.

The control inputs of MUX 321 and MUX 322 receive the value output by latch 330. Thus, if the value output by latch 330 is a '0' MUX 321 provides the output of comparator 311 to offset adjust 340, and MUX 322 provides the output of comparator 312 to the input of latch 330. If the value output by latch 330 is a '1' MUX 322 provides the output of comparator 311 to the input of latch 330, and MUX 321 provides the output of comparator 312 to offset adjust 340. In response to a timing reference signal, CK, the value received at the input of latch 330 is transferred into latch 330 and held at the output of latch 330. Thus, the value selected by MUX 322 in a previous cycle is transferred to the output of latch 330 to determine which of the sources (comparator 311 or comparator 312) that receiver 300 is to use as a data source and which is to be used for offset cancelation. The output of latch 330 (i.e., received symbol) is provided to offset adjust 340, and as the output of receiver 300.

The output of the non-selected comparator (i.e. the comparator 311 or 312 selected by MUX 321) may be used by offset adjust 340 to adjust the offset of the non-selected comparator. The output of the selected comparator (i.e., the comparator 311 or 312 selected by MUX 322), while being stored by latch 330, may be used by offset adjust 340 to determine which of comparator 311 or 312 provided the sample in the previous cycle that is to be used for offset adjustment. In alternate embodiments, the output of MUX 322 may be provided to offset adjust 340 directly from MUX 322, or the output of another latch holding the value of the selected comparator during a later cycle may be used to determine which of comparator 311 or 312 provided the sample. Offset adjust 340 is operatively coupled to comparator 311 to adjust/reduce/remove the input offset voltage comparator 311 based on the values output by comparator 311 when comparator 311 is the non-selected comparator. Offset adjust is operatively coupled to comparator 312 to adjust/reduce/remove the input offset voltage of comparator 312 based on the values output by comparator 312 when comparator 312 is the non-selected comparator.

Offset adjust 340 may use a contiguous set of the values output by comparators 311 and/or 312 to adjust the input offset voltages. In another embodiment, offset adjust 340 may use selected sample set of the values output by comparators 311 and/or 312 to adjust the input offset voltages. For example, offset adjust 340 may use the values output every $10^{th}$, $100^{th}$, $1000^{th}$, etc., cycle to adjust the input offset voltages. In another embodiment, offset adjust 340 may use randomly selected output values (or values from randomly selected cycles) to adjust the input offset voltages.

Comparator 362 is calibrated to have an input voltage offset that is minimized and/or substantially eliminated. Comparator 362 and/or offset adjust 340 may be configured so that reference comparator 362 samples the output of summer 361 (e.g., the input signal summed with a voltage level TH) signal at the same time as comparators 311-312. It should be understood that there are multiple ways of calibrating comparator 362 to have substantially (or effectively) no input voltage offset. For example, the transition density method described herein with reference to FIGS.

2A-2B, offline comparison of known voltage levels, sweeping an input voltage, etc. may be used to determine and substantially eliminate any input offset voltage comparator 362 may have.

After comparator 362 has been calibrated to have substantially (or effectively) no input voltage offset, offset adjust 340 may adjust the offset of a given non-selected comparator 111 or 312. To adjust the offset of a given non-selected comparator 311 or 312, offset adjust 340 may apply the negative of the corresponding threshold T1 or T2 (i.e., −T1 or −T2, shown in FIG. 3A as TH) of the respective comparator 311 or 312 being adjusted to a first input of summer 361. A second input of summer 361 receives the input signal. The output of summer 361 is applied to the input of comparator 362. The output of summer 361 with the corresponding threshold subtracted forms an arrangement that is equivalent to the corresponding comparator 311 or 312 being adjusted and having a respective T1 or T2 applied its inverting input.

In an embodiment, DAC 360 may be controlled (e.g., swept) to help determine an offset voltage of the respective comparator 311 or 312 being adjusted. When DAC 360 is outputting a voltage equal to the offset voltage of the corresponding comparator 311 or 312 being adjusted, the output of comparator 362 and the output of the comparator 311 or 312 being adjusted will be equal every cycle (or substantially every cycle.) Thus, the input value applied to DAC 360 may be used by offset adjust 340 to adjust the offset of the appropriate one of comparator 311 or 312.

Results obtained by comparing effectively simultaneous samples made by the comparator 311 or 312 being adjusted, and the output of comparator 362 at a given input value to DAC 360 can be used by offset adjust 340 to adjust/minimize/eliminate the input voltage offset of the comparator 311 or 312 being adjusted. For example, if, for a given sample and DAC 360 input value, comparator 362 produced a '1' and comparator 311 produced a '0', then offset voltage adjust 340 could adjust the input to DAC 360 in a manner that would effectively increase the offset of comparator 362—and thereby increase the likelihood the output of comparator 311 would match the output of comparator 362. Conversely, if, for a given sample, comparator 362 produced a '0' and comparator 311 produced a '1', then offset voltage adjust 340 could adjust the input to DAC 360 in a manner that would effectively decrease the offset of comparator 362— and thereby increase the likelihood the output of comparator 311 would match the output of comparator 362. In this manner, offset adjust could 'search' for an offset applied to comparator 362 (e.g., via DAC 360) that matches the offset of the comparator 311 or 312 being adjusted. Once the offsets match, offset adjust 340 can apply the opposite offset to the appropriate comparator 311 or 312 to adjust/minimize/eliminate the offset of that comparator 311 or 312.

In another embodiment, DAC 360 may be set to zero (0) volts. When DAC 360 is outputting zero volts, and summer 361 is subtracting TH (i.e., −T1 or −T2) from the input signal, comparator 362 functions as a 'known good' reference comparator—similar to reference comparator 241 discussed herein with reference to FIGS. 2A-2B.

It should be understood that in some embodiments, summer 361 may not be present or TH may be set to zero (0) volts. In these embodiments, the output of DAC 360 may be controlled to set the threshold of comparator 362 at levels that are equivalent to subtracting TH from the input signal.

Results obtained by comparing effectively simultaneous samples made by the comparator 311 or 312 being adjusted and the 'known good' comparator 362 can be used by offset adjust 340 to adjust/minimize/eliminate the input voltage offset of the comparator 311 or 312 being adjusted. For example, if, for a given sample, comparator 362 (with DAC 360 output at an effective zero volts) produced a '1' and comparator 311 produced a '0', then offset voltage adjust 340 could adjust the offset voltage of comparator 311 in a manner that would effectively decrease threshold T1—and thereby increase the likelihood the output of comparator 311 would match the output of the comparator 362 (with DAC 360 output at an effective zero volts). Conversely, if, for a given sample, comparator 362 (with DAC 360 output at an effective zero volts) produced a '0' and comparator 311 produced a '1', then offset voltage adjust 340 could adjust the offset voltage of comparator 311 in a manner that would effectively increase threshold T1—and thereby increase the likelihood the output of comparator 311 would match the output of the comparator 362 (with DAC 360 output at an effective zero volts).

In an embodiment, offset adjust 340 is circuitry and/or software running on the same integrated circuit as the rest of receiver 300. In another embodiment, offset adjust 340 may be software running on a separate integrated circuit that can control the offsets of comparator 311 and/or comparator 312—for example by writing to one or more registers that control one or more digital-to-analog converters whose output(s) affect the offsets of comparators 311 and/or 312.

Figure 3B:
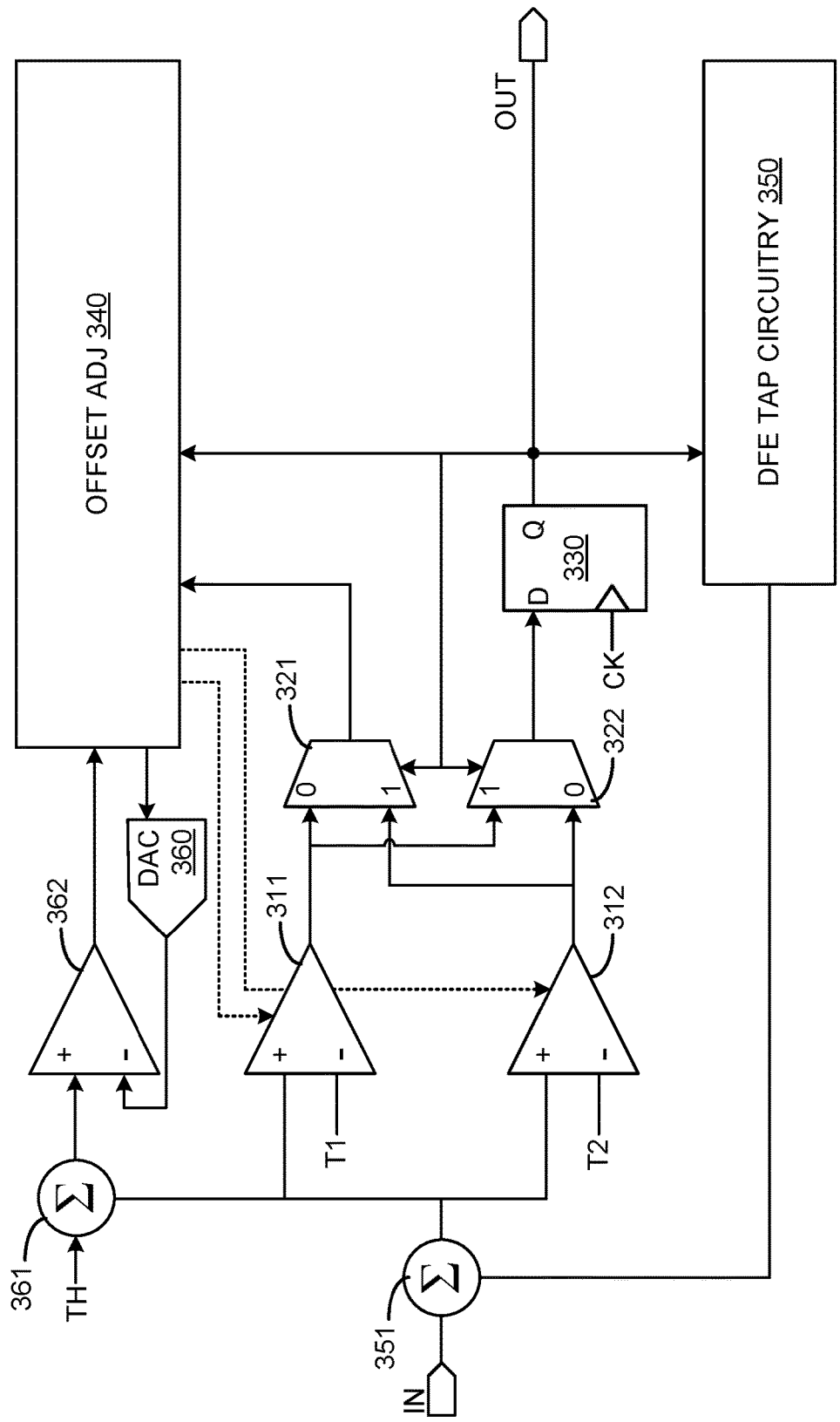

FIG. 3B is a block diagram illustrating a receiver with loop-unrolled decision feedback equalization and offset cancellation that uses an eye monitor comparator. Re-purposing or sharing the eye monitor comparator between eye monitoring and comparator calibrations reduces the amount of circuitry used to implement receiver 301. In FIG. 3B, receiver 301 comprises comparator 311, comparator 312, selector (MUX) 321, selector 322, latch 330, offset adjust 340, decision feedback tap circuitry 350, summer 351, digital-to-analog converter (DAC) 360, summer 361, and comparator 362. Decision feedback tap circuitry 350 and summer 351 is circuitry that represents tap #2 and (if present) higher decision feedback equalization (DFE) for receiver 301, that applies feedback from one or more symbols prior to the immediately preceding symbol. The higher number of DFE taps represented by DFE 350 can further boost the high frequency components of the input signal based on the weighted feedback of more previously received symbols. Thus, DFE 350 can further improve the signal swing before sampling. Comparator 362, DAC 360, and/or summer 361 may be repurposed, in other modes, for use as part of a signal eye monitor.

Offset adjust 340 is operatively coupled to comparator 311. Offset adjust 340 is operatively coupled to comparator 311 to change, adjust, compensate for, or otherwise affect, reduce, minimize and/or eliminate the input offset voltage of comparator 311. Likewise, offset adjust 340 is operatively coupled to comparator 312. Offset adjust 340 is operatively coupled to comparator 312 to change, adjust, compensate for, or otherwise affect, reduce, minimize and/or eliminate the input offset voltage of comparator 312.

Receiver 300 receives an input signal (IN) that is added by summer 351 to a signal received from DFE tap circuitry 350. The output of summer 351 is an equalized input signal. The equalized input signal is provided to comparator 311, comparator 312, and reference comparator 341. Comparator 311 compares the equalized input signal to a first threshold (T1). Comparator 312 compares the equalized input signal to a second threshold (T2). Threshold T1 is greater than threshold T2. Threshold T1 is selected such that when the previous received symbol is a "1", threshold T1 will be met (i.e., equalized input voltage will be higher than T1) by the equalized input signal receiving a "1" on the current cycle and will not be met (i.e., equalized input voltage will be lower than T1) by the equalized input signal receiving a "0" on the current cycle. Threshold T2 is selected such that when the previous received symbol is a "0", threshold T2 will be met (i.e., equalized input voltage will be higher than T2) by the equalized input signal receiving a "1" on the current cycle and will not be met (i.e., equalized input voltage will be lower than T2) by the equalized input signal receiving a "0" on the current cycle.

The output of comparator 311 is provided to the "0" input of MUX 321 and the "1" input of MUX 322. The output of comparator 312 is provided to the "1" input of MUX 321 and the "0" input of MUX 322. The output of MUX 321 is provided to offset adjust 340. The output of MUX 322 is provided to the input of latch 330. The output of latch 330 is provided as the receiver output OUT. The output of latch 330 is also provided to DFE tap circuitry, the control input of MUX 321, the control input of MUX 322, and offset adjust 340.

The control inputs of MUX 321 and MUX 322 receive the value output by latch 330. Thus, if the value output by latch 330 is a "0" MUX 321 provides the output of comparator 311 to offset adjust 340, and MUX 322 provides the output of comparator 312 to the input of latch 330. If the value output by latch 330 is a "1" MUX 321 provides the output of comparator 311 to the input of latch 330, and MUX 322 provides the output of comparator 312 to offset adjust 340. In response to a timing reference signal, CK, the value received at the input of latch 330 is transferred into latch 330 and held at the output of latch 330. Thus, the value selected by MUX 322 in a previous cycle is transferred to the output of latch 330 to determine which of the sources (comparator 311 or comparator 312) that receiver 300 is to use as a data source and which is to be used for offset cancelation. The output of latch 330 (i.e., received symbol) is provided to DFE tap circuitry 350, offset adjust 340, and as the output of receiver 300.

The output of the non-selected comparator (i.e. the comparator 311 or 312 selected by MUX 321) may be used by offset adjust 340 to adjust the offset of the non-selected comparator. The output of the selected comparator (i.e., the comparator 311 or 312 selected by MUX 322) may be used by offset adjust 340 to determine which of comparator 311 or 312 is providing the sample that is to be used for offset adjustment. In alternate embodiments, the output of MUX 322 may be provided to offset adjust 340 directly from MUX 322, or the output of another latch holding the value of the selected comparator during a later cycle may be used to determine which of comparator 311 or 312 provided the sample. Offset adjust 340 is operatively coupled to comparator 311 to adjust/reduce/remove the input offset voltage comparator 311 based on the values output by comparator 311 when comparator 311 is the non-selected comparator. Offset adjust is operatively coupled to comparator 312 to adjust/reduce/remove the input offset voltage of comparator 312 based on the values output by comparator 312 when comparator 312 is the non-selected comparator.

Offset adjust 340 may use a contiguous set of the value output by comparators 311 and/or 312 to adjust the input offset voltages. In another embodiment, offset adjust 340 may use selected sample set of the value output by comparators 311 and/or 312 to adjust the input offset voltages. For example, offset adjust 340 may use the values output every $10^{th}$, $100^{th}$, $1000^{th}$, etc., cycle to adjust the input offset voltages. In another embodiment, offset adjust 340 may use randomly selected output values (or values from randomly selected cycles) to adjust the input offset voltages.

Comparator 362 is calibrated to have an input voltage offset that is minimized and/or substantially eliminated. Comparator 362 and/or offset adjust 340 may be configured so that reference comparator 362 samples the equalized input signal at the same time as comparators 311-312. It should be understood that there are multiple ways of calibrating comparator 362 to have substantially (or effectively) no input voltage offset. For example, the transition density method described herein with reference to FIGS. 2A-2B, offline comparison of known voltage levels, sweeping an input voltage, etc. may be used to determine and substantially eliminate any input offset voltage comparator 362 may have.

To adjust the offset of a given non-selected comparator 311 or 312, offset adjust 340 may apply the negative of the corresponding threshold T1 or T2 (i.e., −T1 or −T2, shown in FIG. 3B as TH) of the respective comparator 311 or 312 being adjusted to a first input of summer 361. A second input of summer 361 receives the equalized input signal. The output of summer 361 is applied to the input of comparator 362. The output of summer 361 with the corresponding threshold subtracted forms an arrangement that is equivalent to the corresponding comparator 311 or 312 being adjusted and having a respective T1 or T1 applied its inverting input.

In an embodiment, DAC 360 may be controlled (e.g., swept) to help determine an offset voltage of the respective comparator 311 or 312 being adjusted. When DAC 360 is outputting a voltage equal to the offset voltage of the corresponding comparator 311 or 312 being adjusted, the output of comparator 362 and the output of the comparator 311 or 312 being adjusted will be equal every cycle (or substantially every cycle.) Thus, the input value applied to DAC 360 may be used by offset adjust 340 to adjust the offset of the appropriate one of comparator 311 or 312.

Results obtained by comparing effectively simultaneous samples made by the comparator 311 or 312 being adjusted, and the output of comparator 362 at a given input value to DAC 360 can be used by offset adjust 340 to adjust/minimize/eliminate the input voltage offset of the comparator 311 or 312 being adjusted. For example, if, for a given sample and DAC 360 input value, comparator 362 produced a "1" and comparator 311 produced a "0", then offset voltage adjust 340 could adjust the input to DAC 360 in a manner that would effectively increase the offset of comparator 362—and thereby increase the likelihood the output of comparator 311 would match the output of comparator 362. Conversely, if, for a given sample, comparator 362 produced a "0" and comparator 311 produced a "1", then offset voltage adjust 340 could adjust the input to DAC 360 in a manner that would effectively decrease the offset of comparator 362— and thereby increase the likelihood the output of comparator 311 would match the output of comparator 362. In this manner, offset adjust could 'search' for an offset applied to comparator 362 (e.g., via DAC 360) that matches the offset of the comparator 311 or 312 being adjusted. Once the offsets match, offset adjust 340 can apply the opposite offset to the appropriate comparator 311 or 312 to adjust/minimize/eliminate the offset of that comparator 311 or 312.

In another embodiment, DAC 360 may be set to zero (0) volts. When DAC 360 is outputting zero volts, and summer 361 is subtracting TH (i.e., −T1 or −T2) from the equalized input signal, comparator 362 functions as a 'known good' reference comparator—similar to reference comparator 241 discussed herein with reference to FIGS. 2A-2B.

Results obtained by comparing effectively simultaneous samples made by the comparator 311 or 312 being adjusted and the 'known good' comparator 362 can be used by offset adjust 340 to adjust/minimize/eliminate the input voltage offset of the comparator 311 or 312 being adjusted. For example, if, for a given sample, comparator 362 (with DAC 360 output at an effective zero volts) produced a "1" and comparator 311 produced a "0", then offset voltage adjust 340 could adjust the offset voltage of comparator 311 in a manner that would effectively increase threshold T1—and thereby increase the likelihood the output of comparator 311 would match the output of the comparator 362 (with DAC 360 output at an effective zero volts). Conversely, if, for a given sample, comparator 362 (with DAC 360 output at an effective zero volts) produced a "0" and comparator 311 produced a "1", then offset voltage adjust 340 could adjust the offset voltage of comparator 311 in a manner that would effectively decrease threshold T1—and thereby increase the likelihood the output of comparator 311 would match the output of the comparator 362 (with DAC 360 output at an effective zero volts).

In an embodiment, offset adjust 340 is circuitry and/or software running on the same integrated circuit as the rest of receiver 301. In another embodiment, offset adjust 340 may be software running on a separate integrated circuit that can control the offsets of comparator 311 and/or comparator 312—for example by writing to one or more registers that control one or more digital-to-analog converters whose output(s) affect the offsets of comparators 311 and/or 312.

Figure 4:
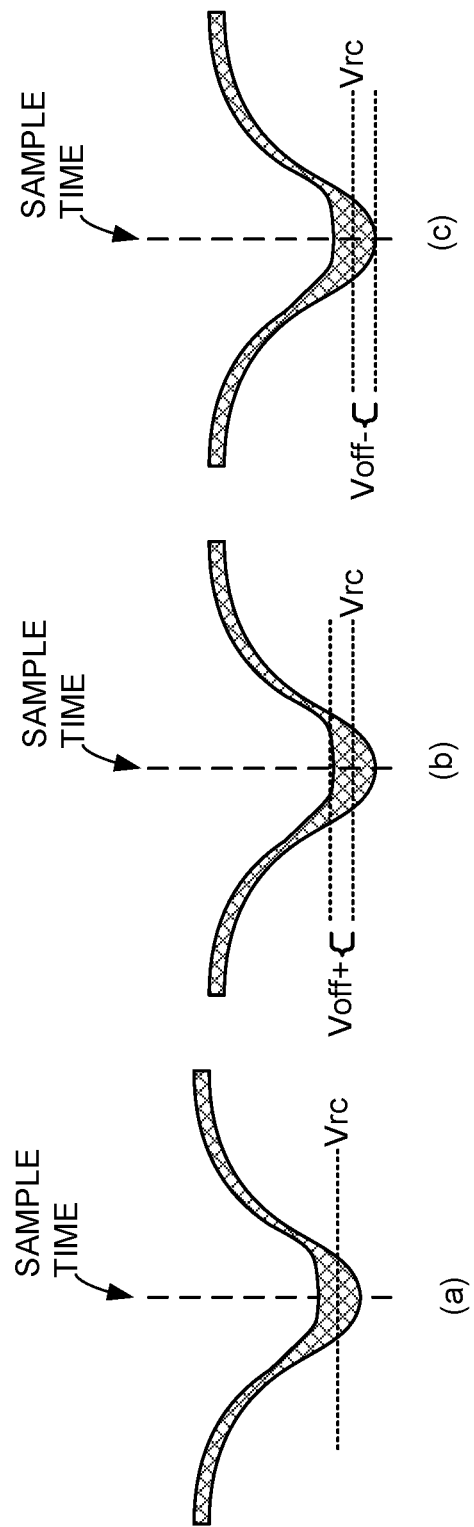
FIG. 4 is an illustration of a reference comparator decision level to a loop-unrolled comparator having decision level offsets.

FIG. 4 is an illustration of a reference comparator decision level to a loop-unrolled comparator having decision level offsets. The sketches (a)-(c) in FIG. 4 illustrate the threshold voltages (horizontal dotted lines) of comparators superimposed on a signal with uncertainty (i.e., noise, ISI, etc.— illustrated with cross-hatching.) The horizontal axis represents time. Sketch (a) illustrates the threshold (Vrc) of a reference comparator. At the sample time, the threshold of the reference comparator is in the center of the noisy range of input voltages. Thus, the output of the reference comparator should be roughly 50% 1's and 50% 0's.

In sketch (b), the threshold (Voff+) of a comparator with a positive offset voltage is additionally illustrated. Thus, since the offset voltage, Voff+ offsets the threshold when compared to the reference comparator, the output of that comparator (and thus also the statistical composition of 1's and 0's) will not match the output of the reference comparator. In particular, in FIG. 4, the outputs of a comparator with a positive offset (Voff+) will exhibit a higher percentage (or count) of 0's than the reference comparator. Similarly, whenever the reference comparator outputs a 1, and the comparator outputs a 0 for the same cycle, it indicates that the comparator has a positive offset.

In sketch (c), the threshold (Voff−) of a comparator with a negative offset voltage is additionally illustrated. Thus, since the offset voltage, Voff− offsets the threshold when compared to the reference comparator, the output of that comparator (and thus also the statistical composition of 1's and 0's) will not match the output of the reference comparator. In particular, in FIG. 4, the outputs of a comparator with a negative offset (Voff−) will exhibit a lower percentage (or count) of 0's than the reference comparator. Similarly, whenever the reference comparator outputs a 0, and the comparator outputs a 1 for the same cycle, it indicates that the comparator has a negative offset.

Figure 5:
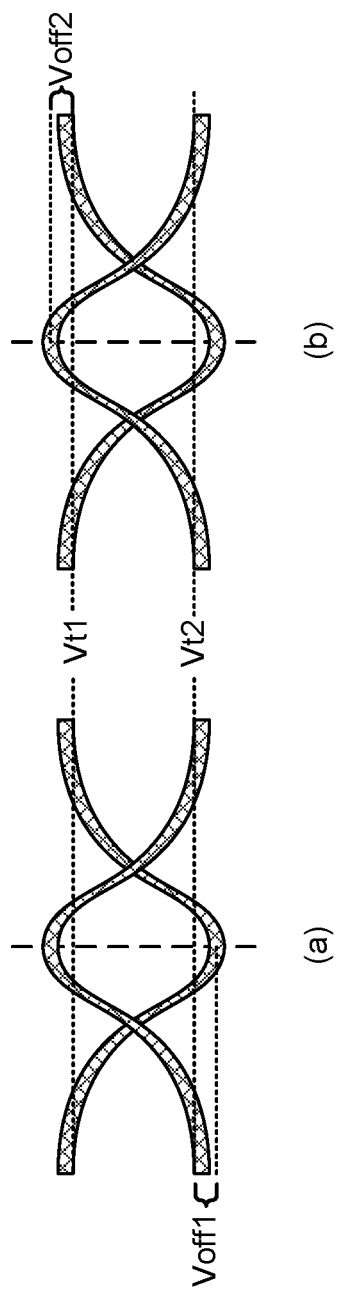
FIG. 5 is an illustration of loop-unrolled comparator offsets.

FIG. 5 is an illustration of loop-unrolled comparator offsets. The sketches (a) and (b) in FIG. 5 illustrate the threshold voltages (horizontal dotted lines) of comparators superimposed on an eye pattern of an NRZ signal with uncertainty (i.e., noise, ISI, etc.— illustrated with cross-hatching.) Other signaling (e.g., PAM-4, PAM-8, etc.) would exhibit a greater (e.g., 3, 7, etc.) number of signal eyes. The horizontal axis represents time. In FIG. 5, threshold voltages Vt1 and Vt2 are illustrated. Threshold voltage Vt1 is used by a first comparator (e.g., comparator 111) to determine the received symbol when the preceding symbol was a 1. Threshold voltage Vt2 is used by a second comparator (e.g., comparator 112) to determine the received symbol when the preceding symbol was a 0. As can be seen in sketch (a), when the comparator receiving Vt1 has a negative offset (Voff1), the signal can, from time to time, be resolved as a '1' when it should have been resolved as a '0'. Likewise, it can be seen from sketch (b), when the comparator receiving Vt2 has a positive offset (Voff2), the signal can, from time to time, be resolved as a '0' when it should have been resolved as a '1'.

Figure 6:
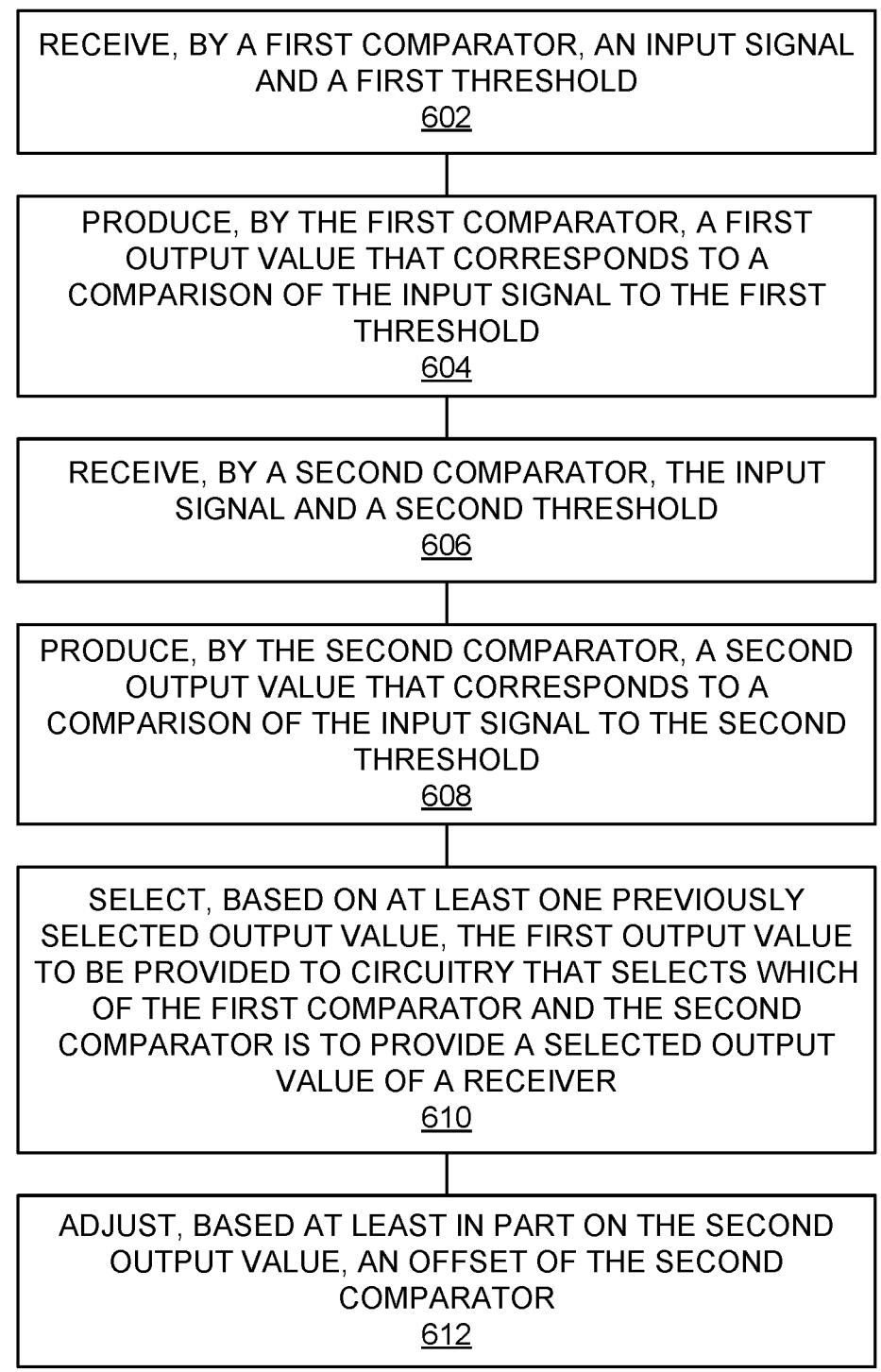
FIG. 6 is a flowchart illustrating a method of adjusting the offset of a comparator.

FIG. 6 is a flowchart illustrating a method of adjusting the offset of a comparator. The steps illustrated in FIG. 6 may be performed by one or more elements of receiver 100, receiver 101, receiver 200, receiver 201, receiver 300, and/or receiver 301. By a first comparator, an input signal and a first threshold are received (602). For example, comparator 111 may receive an input signal from summer 151 and threshold T1. By the first comparator, a first output value that corresponds to a comparison of the input signal to the first threshold is produced (604). For example, comparator 111 may output, to MUX 121 and MUX 122, an output signal that corresponds the comparison of whether the input signal to receiver 100 is greater than, or less than, threshold T1.

By a second comparator, the input signal and a second threshold are received (606). For example, comparator 112 may receive the input signal and a different threshold T2. By the second comparator, a second output value that corresponds to a comparison of the input signal to the second threshold is produced (608). For example, comparator 112 may output, to MUX 121 and MUX 122, an output signal that corresponds the comparison of whether the input signal to receiver 100 is greater than, or less than, threshold T2.

Based on at least one previously selected output value, the first output value is selected to be provided to circuitry that selects which of the first comparator and the second comparator is to provide a selected output value of a receiver (610). For example, the current output value of latch 130 (which is a previously selected value) may cause MUX 122 to select the output of comparator 111 such that comparator 111 will provide the next value output by latch 130. This next value (from comparator 111) output by latch 130 is provided to the output OUT.

Based at least in part on the second output value, an offset of the second comparator is adjusted (612). For example, the current output value of latch 130 may cause MUX 121 to select the output of comparator 112 such that comparator 112 provides its output value to offset adjust 140. Offset adjust 140 uses this value, at least in part, to adjust the offset of comparator 112.

Offset adjust 140 may adjust the offset of comparator 112 based on a statistical analysis of the data output by comparator 112. For example, offset adjust 140 may compare the percentage (or count) of 1's produced by comparator 111 when it is the non-selected comparator to the percentage (or count) of 0's produced by comparator 112 when it is the non-selected comparator. If the comparator output distributions are not 'symmetrical', such that the number of 1's produced by comparator 111 is not substantially equal to (i.e., it deviates from by a statistically significant amount)

the number of 0's produced by comparator 112, then offset adjust 140 may adjust the input offset voltage of comparator 112 in order to produce symmetrical percentages (or counts).

In other words, if comparator 112, when it is the non-selected comparator, produces 52% 1's, then comparator 111, when it is the non-selected comparator, should produce 52% 0's when the relative input voltage offset between comparators 111-112 is substantially eliminated. Offset adjust 140 therefore adjusts the input voltage offset of comparator 112 in a manner intended to produce a 'symmetrical' distribution of 1's and 0's between comparators 111-112 when they are the respective non-selected comparator 111-112.

Figure 7:
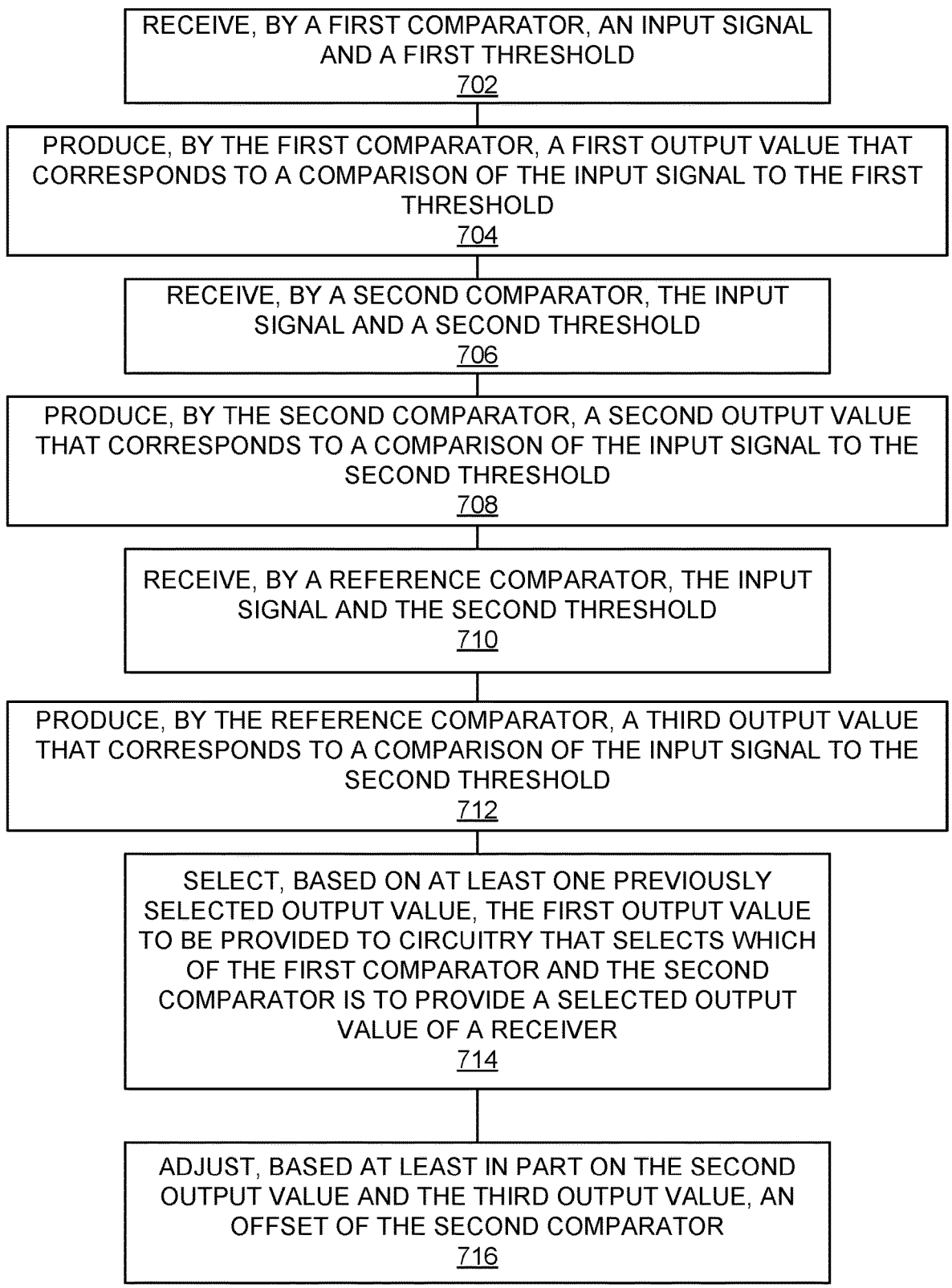
FIG. 7 is a flowchart illustrating a method of using a reference comparator to adjust the offset of a comparator.

FIG. 7 is a flowchart illustrating a method of adjusting the offset of a comparator. The steps illustrated in FIG. 7 may be performed by one or more elements of receiver 100, receiver 101, receiver 200, receiver 201, receiver 300, and/or receiver 301. By a first comparator, an input signal and a first threshold are received (702). For example, comparator 211 may receive an input signal and threshold T1. By the first comparator, a first output value that corresponds to a comparison of the input signal to the first threshold is produced (704). For example, comparator 211 may output, to MUX 221 and MUX 222, an output signal that corresponds the comparison of whether the input signal is greater than, or less than, threshold T1.

By a second comparator, the input signal and a second threshold are received (706). For example, comparator 212 may receive the same input signal and a different threshold T2. By the second comparator, a second output value that corresponds to a comparison of the input signal to the second threshold is produced (708). For example, comparator 212 may output, to MUX 221 and MUX 222, an output signal that corresponds the comparison of whether the input signal is greater than, or less than, threshold T2.

By a reference comparator, the input signal and the second threshold are received (710). For example, reference comparator 241 may receive the same input signal. Reference comparator 241 may also be supplied, by offset adjust 240, a threshold signal that is equivalent, or equal to, threshold T2. Reference comparator 241 may be supplied, by offset adjust 240, the threshold T2 based on a value received from latch 230 (which determines which of comparators 211-212 is the non-selected comparator 211-212.)

By the reference comparator, a third output value that corresponds to a comparison of the input signal to the second threshold is produced (712). For example, reference comparator 241 may output, to other circuitry of offset adjust 240, an output signal that corresponds the comparison of whether the input signal is greater than, or less than, threshold TH—which is equivalent to, or equal to, T2.

Based on at least one previously selected output value, the first output value is selected to be provided to circuitry that selects which of the first comparator and the second comparator is to provide a selected output value of a receiver (714). For example, the current output value of latch 230 (which is a previously selected value) may cause MUX 222 to select the output of comparator 211 such that comparator 211 will provide the next value latched and output by latch 230. This next value (from comparator 211) output by latch 230 is provided to the output OUT.

Based at least in part on the second output value and the third output value, an offset of the second comparator is adjusted (716). For example, when comparator 212 is the non-selected comparator, and reference comparator 241 is configured to compare the input to the same threshold (T2) as comparator 212, and the outputs of comparator 212 and reference comparator 241 do not agree, this indicates that the offset of comparator 212 should be adjusted. If, for example, TH<T2, reference comparator 241 outputs a '1', and comparator 212 output a '0' for the same cycle, then offset adjust 240 may, based on this mismatch, add a negative offset adjustment to comparator 212.

Figure 8:
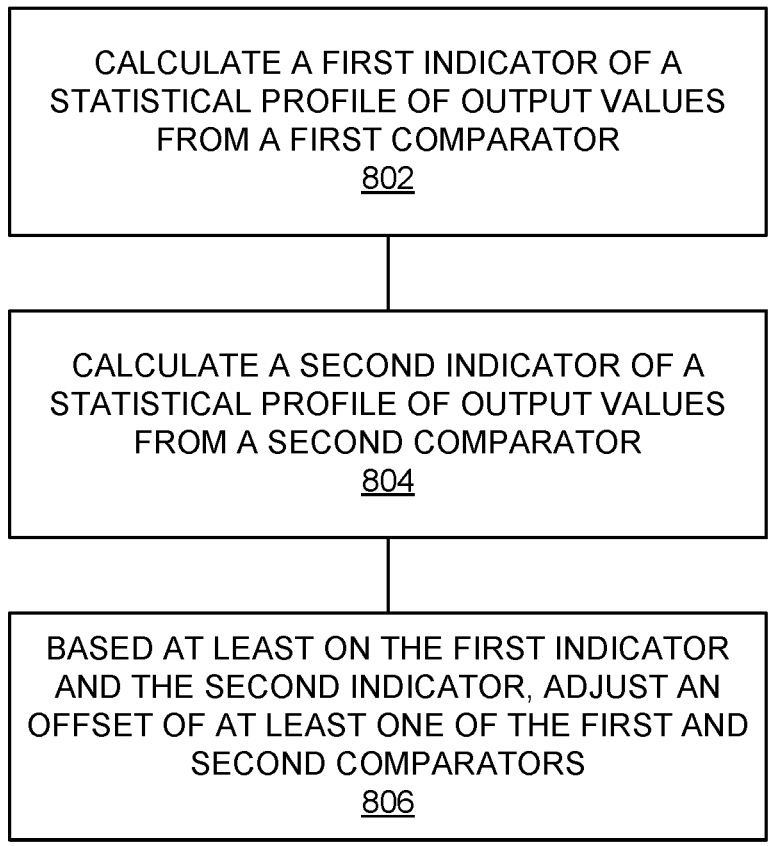
FIG. 8 is a flowchart illustrating a method of using statistics to adjust the offset of a comparator.

FIG. 8 is a flowchart illustrating a method of adjusting the offset of a comparator. The steps illustrated in FIG. 8 may be performed by one or more elements of receiver 100, receiver 101, receiver 200, receiver 201, receiver 300, and/or receiver 301. A first indicator of a statistical profile of output values from a first comparator is calculated (802). For example, offset adjust 140 may calculate, over a plurality of cycles (e.g., 1000, 10000, 1e6, etc.), a percentage (or a count) of 1's (or 0's) output by comparator 111 when comparator 111 is the non-selected comparator.

A second indicator of a statistical profile of output values from a second comparator is calculated (804). For example, offset adjust 140 may calculate, over a plurality of cycles (e.g., 1000, 10000, 1e6, etc.), a percentage (or count) of 0's output by comparator 112 when comparator 112 is the non-selected comparator.

Based at least on the first indicator and the second indicator, an offset of at least one of the first and second comparators is adjusted (806). For example, based on the percentage (or count) of 1's output by comparator 111 when comparator 111 is the non-selected comparator, and percentage (or count) of 0's output by comparator 112 when comparator 112 is the non-selected comparator, offset adjust 140 may adjust the offset of comparator 111 and/or comparator 112. In particular, for example, when the percentage of 1's output by comparator 111 when comparator 111 is the non-selected comparator, and the percentage of 0's output by comparator 112 when comparator 112 is the non-selected comparator are non-symmetrical, offset adjust 140 may adjust the offset of comparator 111 and/or comparator 112 in order to produce statistics that are more symmetrical. This may be repeated until the statistics are substantially symmetrical.

Figure 9:
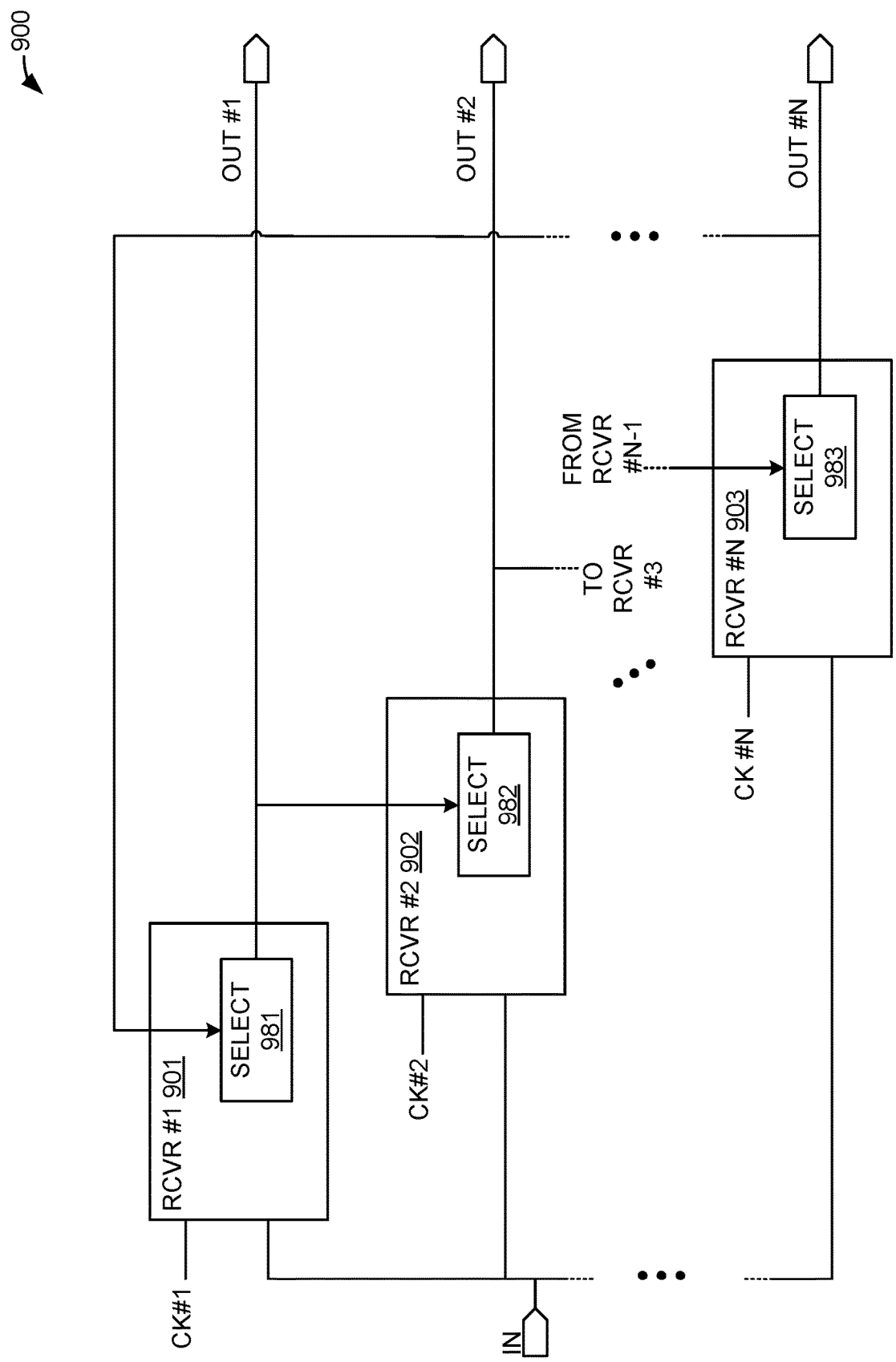
FIG. 9 is a block diagram illustrating a multi-phase loop-unrolled receiver.

FIG. 9 is a block diagram illustrating a multi-phase loop-unrolled receiver. In FIG. 9, receiver 900 comprises loop-unrolled receivers 901-903. Each receiver 901-903 includes selection circuitry 981-983, respectively. Receivers 901-903 may be, or comprise, receiver 100, receiver 101, receiver 200, receiver 201, receiver 300, and/or receiver 301. Each receiver 901-903 receives the same input signal (IN). Each receiver 901-903 receives a different clock signal, CK #1, CK #2 . . . CK #N. respectively. Thus, rather than sampling based on a single clock (i.e., N=1), the receiver 900 illustrated in FIG. 9 can sample based on N number of clocks. This may relax the timing requirements of receiver 100, receiver 101, receiver 200, receiver 201, receiver 300, and/or receiver 301.

The output (OUT #1) of receiver #1 901 is provided to selection circuitry 982 of receiver #2 902. The output of receiver #1 901 is provided to selection circuitry 982 of receiver #2 902 to provide selection circuitry 982 with the previous symbol received on the input signal IN. This allows the selection circuitry 982 of receiver #2 902 to provide selection circuitry 982 to select the output of the comparator (e.g., comparator 121 or 122) having a threshold that equalizes for the symbol received by receiver #1 901. The output (OUT #2) of receiver is provided to receiver #3 (not shown in FIG. 9), and so on with receiver #N 903 receiving the previous symbol as received by receiver #N−1 (not shown in FIG. 9). The output of receiver #N 903 is provided to selection circuitry 981 of receiver #1 901 to provide selection circuitry 981 with the previous symbol received on the input signal IN. This allows the selection circuitry 981 of receiver #1 901 to select the output of the comparator (e.g., comparator 121 or 122) having a threshold that equalizes for the symbol received by receiver #N 903.

In an embodiment, CK1, CK2 CK #N are phased to receive consecutive symbols on the input signal IN. Thus, as can be understood from FIG. 9, the output (Out #1, OUT #2, etc.) of one receiver 901-903 feeds into the selection logic of the next such that each of selection circuitry 901-903 is bases its decision of which comparator output to select on a previously received symbol.

It should be understood that the foregoing description is made with reference to an NRZ signal. This is merely an example. The circuitry and techniques described herein may be applied to signaling schemes (e.g., PAM-4, PAM-8, etc.) with a greater number of signal eyes and a greater number of comparators used for loop-unrolling.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of receiver 100, receiver 101, receiver 200, receiver 201, receiver 300, receiver 301, and/or receiver 900, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 10:
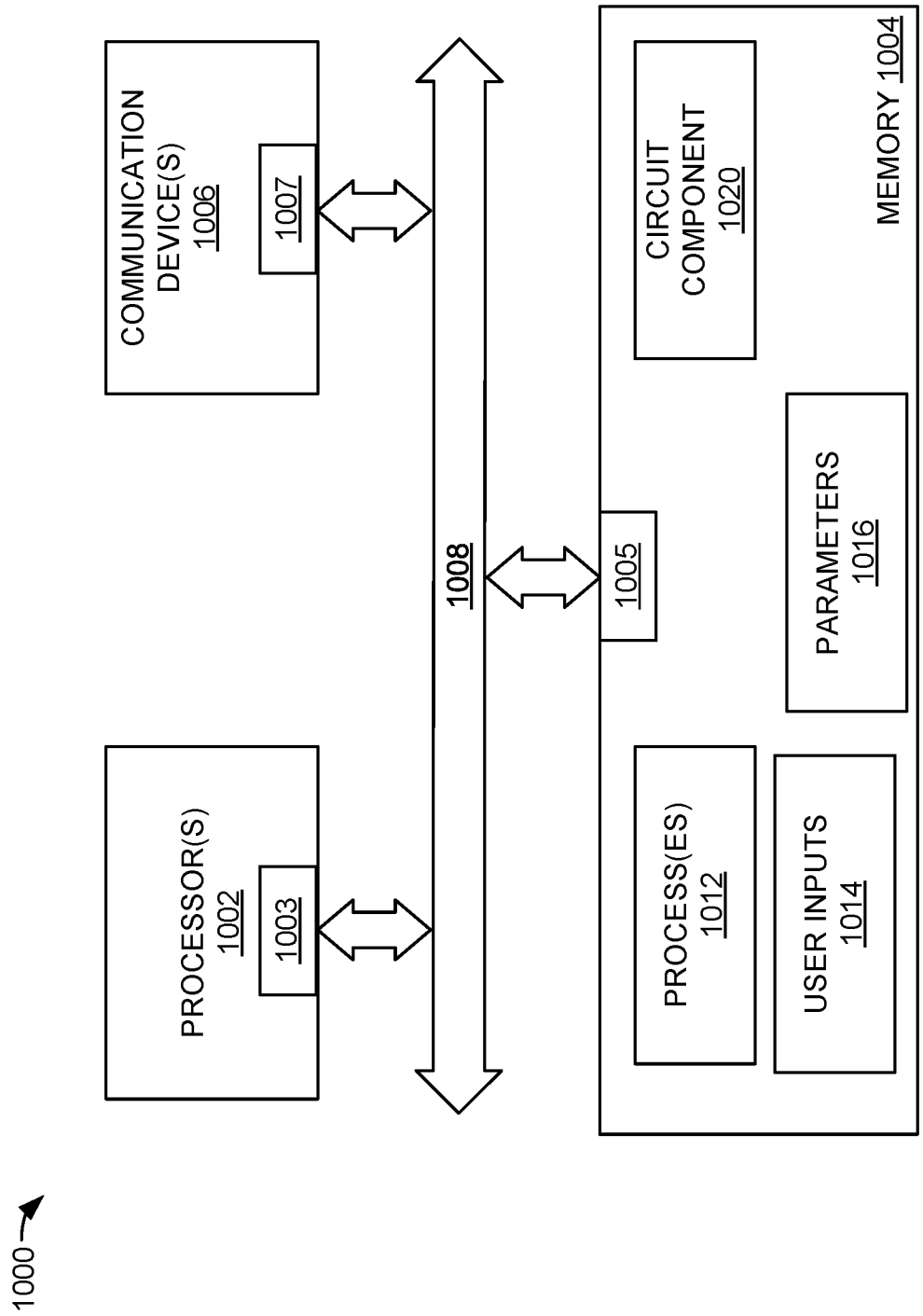
FIG. 10 is a block diagram illustrating a processing system.

FIG. 10 is a block diagram illustrating one embodiment of a processing system 1000 for including, processing, or generating, a representation of a circuit component 1020. Processing system 1000 includes one or more processors 1002, a memory 1004, and one or more communications devices 1006. Processors 1002, memory 1004, and communications devices 1006 communicate using any suitable type, number, and/or configuration of wired and/or wireless connections 1008. Processors 1002 may include one or more receivers 1003. Memory 1004 may include one or more receivers 1005. Communications device 1006 may include one or more receivers 1007. Receivers 1003, 1005, and/or 1007 may be, or comprise, receiver 100, receiver 101, receiver 200, receiver 201, receiver 300, receiver 301, and/or receiver 900.

Processors 1002 execute instructions of one or more processes 1012 stored in a memory 1004 to process and/or generate circuit component 1020 responsive to user inputs 1014 and parameters 1016. Processes 1012 may be any suitable electronic design automation (EDA) tool or portion thereof used to design, simulate, analyze, and/or verify electronic circuitry and/or generate photomasks for electronic circuitry. Representation 1020 includes data that describes all or portions of receiver 100, receiver 101, receiver 200, receiver 201, receiver 300, receiver 301, and/or receiver 900, and their components, as shown in the Figures.

Representation 1020 may include one or more of behavioral, register transfer, logic component, transistor, and layout geometry-level descriptions. Moreover, representation 1020 may be stored on storage media or communicated by carrier waves.

Data formats in which representation 1020 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1014 may comprise input parameters from a keyboard, mouse, voice recognition interface, microphone and speakers, graphical display, touch screen, or other type of user interface device. This user interface may be distributed among multiple interface devices. Parameters 1016 may include specifications and/or characteristics that are input to help define representation 1020. For example, parameters 1016 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1004 includes any suitable type, number, and/or configuration of non-transitory computer-readable storage media that stores processes 1012, user inputs 1014, parameters 1016, and circuit component 1020.

Communications devices 1006 include any suitable type, number, and/or configuration of wired and/or wireless devices that transmit information from processing system 1000 to another processing or storage system (not shown) and/or receive information from another processing or storage system (not shown). For example, communications devices 1006 may transmit circuit component 1020 to another system. Communications devices 1006 may receive processes 1012, user inputs 1014, parameters 1016, and/or circuit component 1020 and cause processes 1012, user inputs 1014, parameters 1016, and/or circuit component 1020 to be stored in memory 1004.

The foregoing description has been presented for purposes of illustration and description. It is not intended to be exhaustive or to limit the claims to the precise form below, and other modifications and variations may be possible in light of the above teachings. The embodiments were chosen and described in order to best explain the principles and their practical application to thereby enable others skilled in the art to best utilize the teachings in various embodiments and various modifications as are suited to the particular use contemplated.

What is claimed is:
1. An integrated circuit, comprising:
comparator circuitry to receive an input signal, a first threshold, and a second threshold, and to, based on a first comparison of the input signal to the first threshold and a second comparison of the input signal to the second threshold, respectively produce a first comparison output and a second comparison output;

selection circuitry to, based on a previous selected value output by the selection circuitry, output a selected one of the first comparison output and a second comparison output as a selected value output by the selection circuitry and output an other one of the first comparison output and the second comparison output as a non-selected value output by the selection circuitry; and adjustment circuitry to receive an adjustment value that is based on the non-selected value output by the selection circuitry, that alters an offset associated with a one of the first comparison and the second comparison.

2. The integrated circuit of claim 1, wherein the adjustment value is further based on a plurality of non-selected values output by the selection circuitry.

3. The integrated circuit of claim 2, wherein the adjustment value is based on a statistical property of the plurality of non-selected values output by the selection circuitry.

4. The integrated circuit of claim 3, wherein the statistical property is based on a first count of a first value in the non-selected values output by the selection circuitry and a second count of a second value in the non-selected values output by the selection circuitry.

5. The integrated circuit of claim 3, wherein the adjustment value is based on equalizing a first count of a first value in the non-selected values output by the selection circuitry and a second count of a second value in the non-selected values output by the selection circuitry.

6. The integrated circuit of claim 3, wherein the adjustment value is based on equalizing a first percentage associated with a first value in the non-selected values output by the selection circuitry and a second percentage associated with a second value in the non-selected values output by the selection circuitry.

7. The integrated circuit of claim 1, wherein the adjustment value is received from a separate integrated circuit.

8. A system, comprising:
circuitry configured to receive a first plurality of output values produced by first comparisons between an input signal and a first threshold, and to receive a second plurality of output values produced, concurrently with the first comparisons, by second comparisons between the input signal and a second threshold;

circuitry configured to select between concurrently produced ones of the first plurality of output values and ones of the second plurality of output values to produce a plurality of selected output values and a plurality of non-selected output values, the selection between concurrently produced ones of the first plurality of output values and ones of the second plurality of output values to be based on a previous one of the plurality of selected output values; and circuitry configured to, based on the plurality of non-selected output values, adjust a first input offset of third comparisons between the input signal and the first threshold.

9. The system of claim 8, wherein a second input offset of fourth comparisons between the input signal and the second threshold is based on the plurality of non-selected output values.

10. The system of claim 9, wherein the first input offset is adjusted based on a first statistical property of the plurality of non-selected output values and the second input offset is adjusted based on a second statistical property of the plurality of non-selected output values.

11. The system of claim 10, wherein the first statistical property is based on a first count of a first value in the non-selected output values and a second count of a second value in the non-selected output values and the second statistical property is based on a third count of a first value in the non-selected output values and a fourth count of a second value in the non-selected output values.

12. The system of claim 8, wherein the first input offset is adjusted based on a first statistical property of the plurality of non-selected output values.

13. The system of claim 12, wherein the first statistical property is based on a first count of a first value in the non-selected output values and a second count of a second value in the non-selected output values.

14. The system of claim 12, wherein the first input offset is adjusted based on equalizing a first count of a first value in the non-selected output values and a second count of a second value in the non-selected output values.

15. The system of claim 12, wherein the first input offset is based on equalizing a first percentage associated with a first value in the non-selected output values and a second percentage associated with a second value in the non-selected output values.

16. A method of adjusting an input offset voltage of a comparator, comprising: receiving a first plurality of output values corresponding to a corresponding first plurality of comparisons of an input signal to a first threshold;

receiving a second plurality of output values corresponding to a corresponding second plurality of comparisons of the input signal to a second threshold;

selecting, based on at least one previously selected output value, between each one of the first plurality of output values and each one of the second plurality of output values that were concurrently produced to produce a plurality of selected output values and a plurality of non-selected output values; and based on the plurality of non-selected output values, adjusting the input offset voltage of the comparator.

17. The method of claim 16, wherein the comparator produced the first plurality of output values.

18. The method of claim 16, wherein the comparator produced the second plurality of output values.

19. The method of claim 16, further comprising: performing a statistical analysis of the plurality of non-selected output values.

20. The method of claim 16, wherein the first plurality of output values are a result of a non-contiguous set of comparisons by the comparator.

* * * * *